US009361823B2

(12) United States Patent
Takahama et al.

(10) Patent No.: US 9,361,823 B2
(45) Date of Patent: Jun. 7, 2016

(54) DISPLAY DEVICE

(71) Applicant: Sharp Kabushiki Kaisha, Osaka (JP)

(72) Inventors: Kengo Takahama, Osaka (JP); Shigetsugu Yamanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/375,786

(22) PCT Filed: Feb. 28, 2013

(86) PCT No.: PCT/JP2013/055310
§ 371 (c)(1),
(2) Date: Jul. 30, 2014

(87) PCT Pub. No.: WO2013/136998
PCT Pub. Date: Sep. 19, 2013

(65) Prior Publication Data

US 2014/0375700 A1 Dec. 25, 2014

(30) Foreign Application Priority Data

Mar. 14, 2012 (JP) ................................ 2012-057271

(51) Int. Cl.
*G09G 5/10* (2006.01)
*G09G 3/20* (2006.01)
(Continued)

(52) U.S. Cl.
CPC ............ *G09G 3/2003* (2013.01); *G09G 3/3208* (2013.01); *G09G 3/3258* (2013.01); *G09G 5/02* (2013.01); *G09G 2300/0819* (2013.01); *G09G 2300/0861* (2013.01); *G09G 2320/0223* (2013.01); *G09G 2320/0242* (2013.01); *G09G 2320/0271* (2013.01); *G09G 2320/0666* (2013.01); *G09G 2320/0673* (2013.01); *G09G 2330/023* (2013.01); *H01L 51/50* (2013.01)

(58) Field of Classification Search
CPC ...... G09G 3/30; G09G 3/2003; G09G 3/3208
See application file for complete search history.

(56) References Cited

U.S. PATENT DOCUMENTS

2003/0146887 A1 8/2003 Mametsuka
2004/0046718 A1 3/2004 Osame et al.
(Continued)

FOREIGN PATENT DOCUMENTS

JP 2003-228332 A 8/2003
JP 2004-101767 A 4/2004
(Continued)

OTHER PUBLICATIONS

International Search Report received for PCT Application No. PCT/JP2013/055310, mailed Mar. 26, 2013, 4 pages (2 pages of English Translation and 2 pages of PCT Search Report).

*Primary Examiner* — Dennis Joseph
(74) *Attorney, Agent, or Firm* — Morrison & Foerster LLP

(57) ABSTRACT

In a display device (110) provided with pixel circuits including organic EL elements, a display control circuit (1) calculates a voltage drop amount VRI of a power line due to display for each frame on the basis of an integrated value for display data, and a tone voltage generation circuit (9) adjusts reference voltages for a tone voltage on the basis of the integrated value in order to compensate for the voltage drop amount VRI. As a result, it is possible to compensate for the voltage drop of the power line with accuracy without increasing power consumption and the wiring in the pixel circuits.

10 Claims, 21 Drawing Sheets

(51) Int. Cl.

| | |
|---|---|
| ***G09G 3/32*** | (2016.01) |
| ***G09G 5/02*** | (2006.01) |
| *H01L 51/50* | (2006.01) |

(56) References Cited

U.S. PATENT DOCUMENTS

| | | | | |
|---|---|---|---|---|
| 2008/0094425 | A1 | 4/2008 | Asano | |
| 2009/0201281 | A1 * | 8/2009 | Routley | G09G 3/3233 345/212 |
| 2010/0201674 | A1 | 8/2010 | Kim et al. | |
| 2011/0018787 | A1 | 1/2011 | Nakamura et al. | |
| 2011/0242087 | A1 * | 10/2011 | Ebisuno | G09G 3/3233 345/212 |

FOREIGN PATENT DOCUMENTS

| | | | |
|---|---|---|---|
| JP | 2004-118184 | A | 4/2004 |
| JP | 2008-102235 | A | 5/2008 |
| JP | 2010-181877 | A | 8/2010 |
| JP | 2011-027819 | A | 2/2011 |

* cited by examiner

DISPLAY DEVICE

CROSS REFERENCE TO RELATED APPLICATIONS

This is a U.S. National Phase patent application of PCT/JP2013/055310, filed Feb. 28, 2013, which claims priority to Japanese patent application no. 2012-057271 filed Mar. 14, 2012, each of which is hereby incorporated by reference in the present disclosure in its entirety.

TECHNICAL FIELD

The present invention relates to display devices, and more specifically, the invention relates to a display device, such as an organic EL display, which includes light-emitting display elements driven by a current, and a method for driving the same.

BACKGROUND ART

Organic EL (electroluminescent) displays are conventionally known as being thin display devices featuring high image quality and low power consumption. The organic EL display has a plurality of pixel circuits arranged in a matrix, each circuit including an organic EL element, which is a light-emitting display element driven by a current, and a drive transistor for driving the element.

The method for controlling the amount of current to be applied to current-driven display elements such as organic EL elements as above are generally classified into: a constant-current control mode (or a current-programmed drive mode) in which the current that is to be applied to display elements is controlled by data signal currents flowing through data signal line electrodes of the display elements; and a constant-voltage control mode (or a voltage-programmed drive mode) in which the current that is to be applied to display elements is controlled by voltages corresponding to data signal voltages. Among these modes, when the constant-voltage control mode is used for display on an organic EL display, it is necessary to compensate for variations in threshold voltage among drive transistors and current reduction in the organic EL elements (luminance decay). On the other hand, an the case of the constant-current control mode, the values for data signal currents are controlled such that constant currents are applied to organic EL elements regardless of the threshold voltages and internal resistance of the organic EL elements, and therefore, the compensation as mentioned above is normally unnecessary. However, the constant-current control mode is known to require more drive transistors and more wiring lines than the constant-voltage control mode, which leads to a lower aperture ratio, and therefore, the constant-voltage control mode is widely employed.

In such a configuration employing the constant-voltage control mode, the current to be applied to the organic EL element is determined by the drive (control) transistor, but the potential of the power supply is not always kept constant, and might experience a voltage drop (i.e., an IR drop) due to the resistance of a power supply line and the current flowing through the line.

Particularly in the case of an image where the average tone value of the pixels to be displayed is high (a bright image), the current flowing through the power supply line increases, and therefore, the control voltage of the drive transistor is affected by the aforementioned voltage drop, resulting in a further drop in the voltage, leading to a reduction in display quality, such as deviations in the colors of the image to be displayed or portions with low tones being darkened.

Therefore, to compensate for such a voltage drop, for example, Japanese Laid-Open Patent Publication No. 2004-101767 discloses a display device that is configured to measure currents flowing to organic EL elements and appropriately correct the values of tone voltages to be provided to the drive transistors.

Furthermore, for example, Japanese Laid-Open Patent Publication No, 2010-181877 discloses a display device in which, in addition to a first power supply line, which is a regular power supply line, a second power supply line for voltage drop compensation is provided, and the first and second power supply lines are connected appropriately.

CITATION LIST

Patent Documents

Patent Document 1: Japanese Laid-Open Patent Publication No. 2004-101767

Patent Document 2: Japanese Laid-Open Patent Publication. No. 2010-181877

SUMMARY OF THE INVENTION

Problems to be Solved by the Invention

The display device including the feature for measuring currents, as disclosed in Japanese Laid-Open Patent Publication No 2004-101767, can measure an actual flowing current, but requires a current for measurements, resulting in increased power consumption. Further, a voltage corresponding to the current for measurements might affect (the control voltage of) the drive transistor, and in such a case, display quality is degraded.

Furthermore, in the case of the display device including the second power supply line for voltage drop compensation, as disclosed in Japanese Laid-Open. Patent Publication No. 2010-181877, a wiring area for arranging the power supply line is required, which makes it difficult to achieve high definition display. Basically, the difference in potential between the first and second power supply lines cannot be used for voltage drop compensation without modification, and therefore, in many cases, voltage drop compensation does not produce a sufficiently effective result. Therefore, an objective of the present invention is to provide: a display device for accurately compensating for a voltage drop of a power supply line, without increasing power consumption and the wiring in pixel circuits.

Solution to the Problems

A first aspect of the present invention is directed to an active-matrix display device comprising:

a plurality of video signal lines for transmitting signals representing an image to be displayed;

a plurality of scanning signal lines crossing the video signal lines;

a plurality of pixel circuits arranged in a matrix corresponding to intersections of the video signal lines and the scanning signal lines, to display a plurality of pixels forming the image to be displayed;

a power line for providing a power supply voltage to the pixel circuits;

a scanning signal line driver circuit for selectively driving the scanning signal lines;

a video signal line driver circuit for driving the video signal lines by applying the signals representing the image to be displayed;

a tone voltage generation portion for generating a plurality of tone voltages on the basis of reference voltages for voltages to be applied to the video signal lines; and a power supply circuit for providing a power supply voltage to the power line, wherein, the pixel, circuits include respective electro-optical elements driven by a current provided through the power line, and the tone voltage generation portion calculates a voltage drop amount of the power line due to the image being displayed, on the basis of tone values indicating display luminances of the pixels, and sets the reference voltage on the basis of the calculated voltage drop amount.

In a second aspect of the present invention, based on the first aspect of the invention, the tone voltage generation portion includes:

a voltage drop amount calculation portion for calculating the voltage drop amount on the basis of a value obtained by integrating tone values indicating display luminances of at least a part of the pixels;

a reference voltage setting portion for setting the reference voltage on the basis of the voltage drop amount; and a tone voltage output portion for generating and outputting the tone voltage values on the basis of the reference voltage.

In a third aspect of the present invention, based on the second aspect of the invention, the reference voltage setting portion sets maximum and minimum values for the tone voltages as reference voltages on the basis of the voltage drop amount, and the tone voltage output portion generates and outputs the tone voltages on the basis of the maximum and minimum values.

In a fourth aspect of the present invention, based on the third aspect of the invention, the pixel circuits display respective primary colors, the reference voltage setting portion sets either the maximum or minimum value or both for each of the primary colors on the basis of the voltage drop amount, and the tone voltage output portion generates and outputs the tone voltage values for each of the primary colors on the basis of the maximum and minimum values.

In a fifth aspect of the present invention, based on the fourth aspect of the invention, for each of the primary colors, the voltage drop amount calculation portion integrates tone values indicating display luminances for at least a part of the pixels displaying the primary color, and calculates the voltage drop amount for the primary color on the basis of the value obtained by the integration for the primary color.

In a sixth aspect of the present invention, based on the fifth aspect of the invention, the power line is provided for each of the primary colors so as to provide corresponding power supply voltages to a plurality of pixel circuits forming a plurality of pixels for displaying the same primary color, and the power supply circuit provides the corresponding power supply voltage to the power line provided for each of the primary colors.

In a seventh aspect of the present invention, based on the third aspect of the invention, the reference voltage setting portion sets the maximum value for each of the primary colors and the minimum value common to the primary colors on the basis of the voltage drop amount.

In an eighth aspect of the present invention, based on the third aspect of the invention, the reference voltage setting portion sets the minimum value for each of the primary colors and the maximum value common to the primary colors on the basis of the voltage drop amount.

In a ninth aspect of the present invention, based on the third aspect of the invention, the reference voltage setting portion sets both the maximum and minimum values for each of the primary colors on the basis of the voltage drop amount.

In a tenth aspect of the present invention, based on the third aspect of the invention, the voltage portion is a resistive voltage division circuit for dividing a voltage into voltages ranging from the maximum to the minimum values, the resistive voltage division circuit consisting of a plurality of resistors, the number of which is less than or equal to the number of tone voltages.

In an eleventh aspect of the present invention, based on the tenth aspect of the invention, values for the resistors are set such that a desired gamma characteristic is obtained.

A twelfth aspect of the present invention is directed to a method for driving an active-matrix display device including a plurality of video signal lines for transmitting signals representing an image to be displayed, a plurality of scanning signal lines crossing the video signal lines, a plurality of pixel circuits arranged in a matrix corresponding to intersections of the video signal lines and the scanning signal lines, to display a plurality of pixels forming the image to be displayed, and a power line for providing a power supply voltage to the pixel circuits, the method comprising:

a scanning signal line drive step of selectively driving the scanning signal lines;

a video signal line drive step of driving the video signal lines by applying the signals representing the image to be displayed;

a tone voltage generation step of generating a plurality of tone voltages on the basis of reference voltages for voltages to be applied, to the video signal lines; and a power supply step of providing a power supply voltage to the power line, wherein, the pixel circuits include respective electro-optical elements driven by a current provided through the power line, and in the tone voltage generation step, a voltage drop amount of the power line due to the image being displayed is calculated on the basis of tone values indicating display luminances of the pixels, and the reference voltage is set on the basis of the calculated voltage drop amount.

Effect of the Invention

In the first aspect of the present invention, the tone voltage generation portion calculates a voltage drop amount of the power line due to an image being displayed, on the basis of tone values indicating display luminances of a plurality of pixels, and sets reference voltages on the basis of the calculated voltage drop amount, so that it is possible to eliminate the need to apply a detection current in order to detect a voltage drop amount, resulting in no increase in power consumption, it is also possible to eliminate the need to provide wiring for voltage drop amount detection, resulting in no increase in the wiring in the pixel circuits is not increased, and it is possible to compensate for voltage drops with accuracy.

In the second aspect of the present invention, tone values are integrated, and a voltage drop amount is calculated on the basis of the resultant value, so that it is possible to compensate for voltage drops with accuracy using a simplified configuration without increasing power consumption and the wiring in the pixel circuits.

In the third aspect of the present invention, the maximum and minimum values for tone voltages are set as reference voltages, and the tone voltages are generated and outputted on the basis of the maximum and minimum value, so that it is possible to compensate for voltage drops using a simplified configuration without requiring a specialized circuit configuration.

In the fourth aspect of the present invention, at least one of the maximum and minimum values is set for each primary color, a tone voltage value is generated and outputted for each primary color, and therefore, in the case where she pixel circuit configuration varies among the colors, typically, in the case where the configuration of the means for driving an electro-optical element varies among them, it is possible to provide an appropriate tone voltage for each color in accordance with the configuration of the pixel circuit for that color, thereby compensating for the voltage drop with higher accuracy and improving display quality.

In the fifth aspect of the present invention, the tone values are integrated for each primary color, the voltage drop amount is calculated for each primary color on the basis of the resultant value for that color, and therefore, it is possible to compensate for the voltage drop for each color with higher accuracy.

In the sixth aspect of the present invention, the power line is provided for each primary color, corresponding power supply voltages are provided to the power lines provided for the respective primary colors, and therefore, voltage drops occur without any interference between the power lines. Therefore, it is possible to reduce the voltage drop amount itself for each power line, and compensate for the voltage drop for each color with higher accuracy.

In the seventh aspect of the present invention, the maximum value is set for each primary color, and one minimum value common to the primary colors is set, so that circuits, etc., can be shared, making it possible to reduce manufacturing cost, and changes in tone in the low tone range due to the voltage drop can be suppressed, resulting in improved display quality.

In the eighth aspect of the present invention, the minimum value is set for each primary color, and one maximum value common to the primary colors is set, so that circuits, etc., can be shared, making it possible to reduce manufacturing cost, and even if there are deviations in she colors, such deviations can be adjusted by controlling the minimum value appropriately, resulting in improved display quality.

In the ninth aspect of the present invention, both the maximum and minimum values can be set for each primary color, so that manufacturing cost can be reduced by sharing circuits, etc., changes in tone in the low tone range due to the voltage drop can be suppressed, and even if there are deviations in the colors, such deviations can be adjusted, resulting in further improved display.

In the tenth aspect of the present invention, the resistive voltage division circuit for dividing a voltage into voltages ranging from the maximum to the minimum values is used, and therefore, it is possible to generate tone voltages using a simplified circuit configuration. Further, by using such a resistive voltage division circuit, it is rendered possible to generate high-definition tone data without generating any invalid output voltage.

In the eleventh aspect of the present invention, a plurality of resistance values are set such that a desired gamma characteristic can be obtained, and therefore, display quality can be improved.

The twelfth aspect of the present invention allows a method for driving a display device as above to achieve effects similar to those achieved by the first aspect of the invention.

MODES FOR CARRYING OUT THE INVENTION

1. First Embodiment

1.1 Overall Configuration

Figure 1:
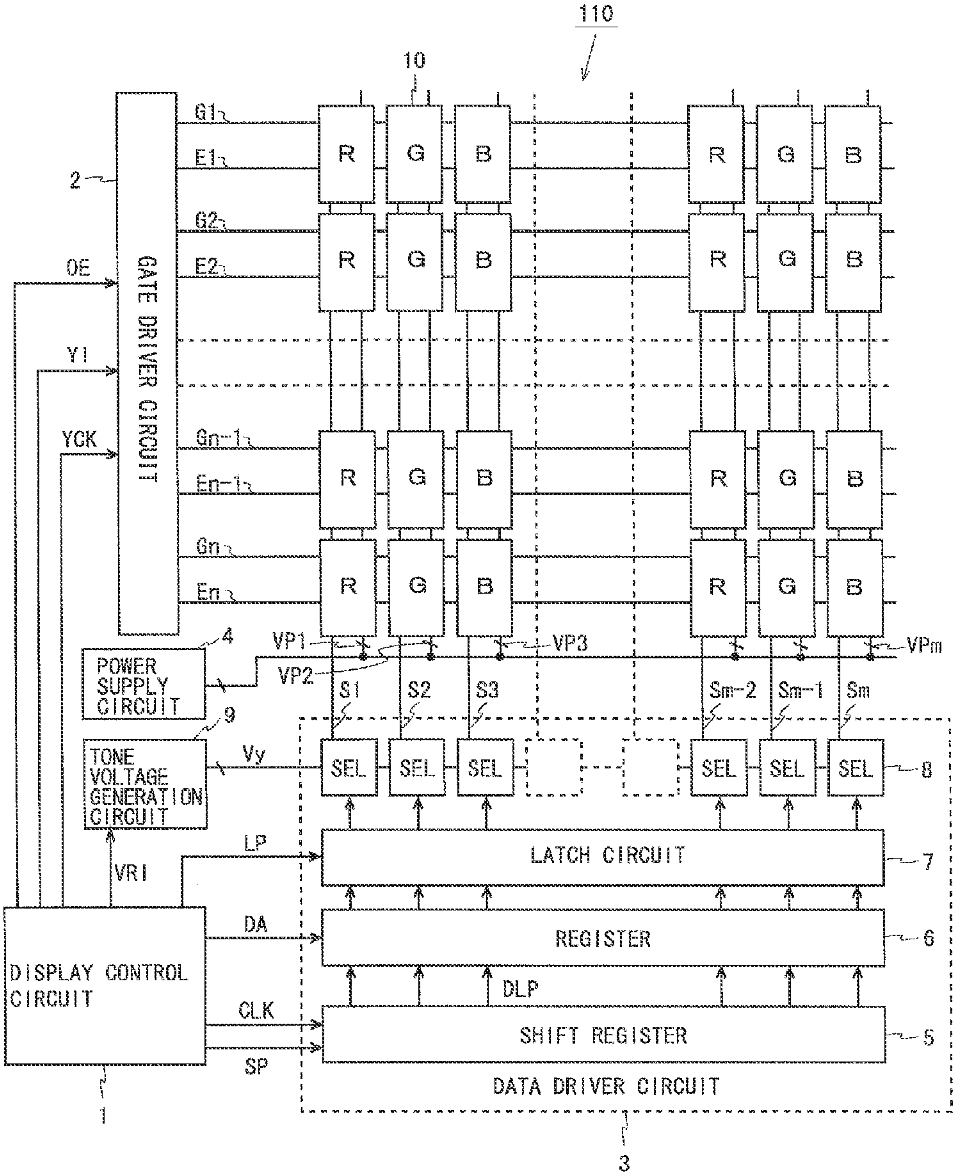
FIG. 1 is a block diagram illustrating the configuration of a display device according to a first embodiment of the present invention.

FIG. 1 is a block diagram illustrating the configuration of a display device according to a first embodiment of the present invention. The display device 110 shown in FIG. 1 is an organic EL display including a display control circuit 1, a gate driver circuit 2, a data driver circuit 3, a power supply circuit 4, a tone voltage generation circuit 9, and (m×n) pixel circuits

10. In the following, m and n are integers of 2 or more, i is an integer greater than or equal to 1 but less than or equal to n, and j is an integer greater than or equal to 1 but less than or equal to m.

The display device 110 is provided with a parallel scanning signal lines $G_i$ and m parallel data lines $S_j$ perpendicular thereto. Although omitted in the figure, there are further provided scanning signal lines $G_0$ for initialization control to be described later. The (m×n) pixel circuits 10 are arranged in a matrix corresponding to the intersections of the scanning signal lines $G_i$ and the data lines $S_j$, and display pixels in respective colors to constitute a display image. Moreover, a control lines $E_i$ are provided parallel to the scanning signal lines $G_i$, and a pairs of power lines $VP_i$ are provided parallel to the data lines $S_j$. The scanning signal lines $G_i$ and the control lines $E_i$ are connected to the gate driver circuit 2, and the data lines $S_j$ are connected to the data driver circuit 3. Each pair of the power lines $VP_i$ provides two potentials to be described later, and is connected to the power control circuit. 4 via two corresponding portions of a common power line, which is a current-supply trunk line. The pixel circuit 10 is supplied with a common potential Vcom by an unillustrated common electrode. Here, each pair of power lines $VP_i$ is connected at one end to the two portions of the common power line, but each pair of power lines $VP_i$ may be connected at both ends (or at three or more connecting points).

The display control circuit 1 outputs control signals to the gate driver circuit 2, the data driver circuit 3, and the power control circuit 4. More specifically, the display control circuit 1 outputs a timing signal OE, a start pulse YI, and a clock YCK to the gate driver circuit 2, a start pulse SP, a clock CLK, display data DA, and a latch pulse LP to the data driver circuit 3, a control signal CS to the power control circuit 4, and a voltage drop amount VRI of the power line, which will be described later, to the tone voltage generation circuit 9.

The gate driver circuit 2 includes a shift register circuit, a logical operation circuit, and a buffer (none of the above is shown in the figure). The shift register circuit sequentially transfers the start pulses YI in synchronization with the clock YCK. The logical operation circuit performs a logical operation between the timing signal OE and a pulse outputted from each stage of the shift register circuit. Outputs from the logical operation circuit are provided through the buffer to their corresponding scanning signal lines $G_i$ and control lines $E_i$. Each scanning signal line $G_i$ as connected to m pixel circuits 10, and the m pixel circuits 10 are collectively selected through the scanning signal line $G_i$.

The tone voltage generation circuit 9 outputs a plurality of tone voltages Vy to be provided to the data lines $S_j$. The tone voltages Vy are analog voltage signals corresponding to display tone values, and on the basis of the voltage drop amount VRI provided by the display control circuit 1, a drop in the power supply voltage due to light emission by the organic EL elements is compensated for, as will be described later.

The data driver circuit 3 includes an m-bit shift register 5, a register 6, a latch circuit 7, and m selector circuits 8. The shift register 5 has in cascaded registers, such that a start pulse SP supplied to the register in the first stage is transferred in synchronization with a clock CLK, and the register in each stage outputs a timing pulse OLE. The register 6 is supplied with display data DA in accordance with the output timing of the timing pulses DLP. The register 6 stores the display data DA in accordance with the timing pulses DLP. When the register 6 has stored display data DA for one row, the display control circuit 1 outputs a latch pulse LP to the latch circuit 7. Upon reception of the latch pulse LP, the latch circuit 7 holds the display data stored in the register 6. The selector circuits 8 are provided corresponding to the data lines $S_j$. From among the tone voltages Vy obtained from the tone voltage generation circuit 9, the selector circuits 8 select and output tone voltages corresponding to the display data held in the latch circuit 7. That is, the selector circuits 8 have the function of converting the display data held in the latch circuit 7 into analog voltages.

In accordance with the control signal CS, the power control circuit 4 applies a power supply potential VDD to one of the two portions of the common power line and an initialization potential Vini to the other portion. Since each pair of power lines $VP_i$ is connected to the common power line, as shown in FIG. 1, one of the power lines $VP_i$ is set at the power supply potential VDD and the other at the initialization potential Vini.

1.2 Configuration of the Pixel Circuit

Figure 2:
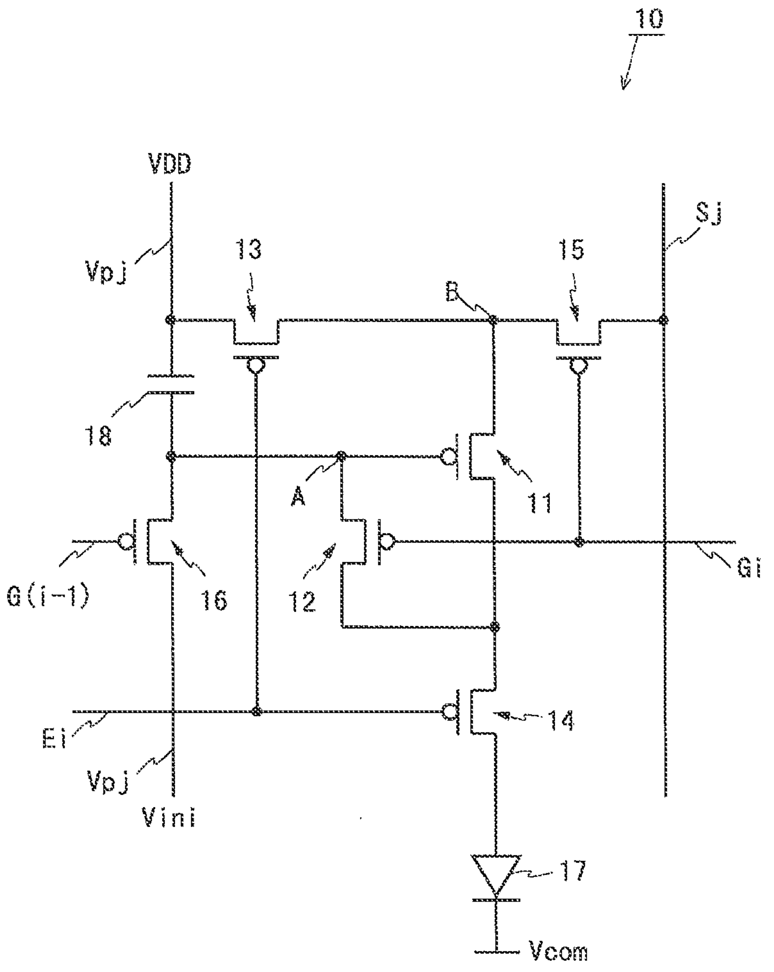
FIG. 2 as a circuit diagram or a pixel circuit an the embodiment.

FIG. 2 is a circuit diagram of the pixel circuit 10. The pixel circuit 10 includes six TFTs 11 to 16, an organic EL element 17, and a data holding capacitor 18, as shown in FIG. 2. All of the six TFTs 11 to 16 are p-channel transistors. Note that all of them may be n-channel transistors, or p-channel, and n-channel transistors may be used in combination depending on the application.

For example, in the case where n-channel transistors are used, similar operations to the above case can be readily realized by inverting, for example, the power supply potential and the level of the control lines, without changing the connection relationships between the TFTs and the capacitors.

Each of the six TFTs 11 to 16 functions as an initialization control transistor, a write control transistor, a drive transistor, or a light-emission control transistor. Note that the functions listed above are simply major functions, and other functions may be provided. The details of the above functions will be described later. Moreover, the organic EL element 17 functions as an electro-optical element.

Note that in addition to the organic EL element, the term "electro-optical element" herein refers to any element whose optical properties change upon application of electricity, e.g., an FED (field emission display) element, an LED, a charge-driven element, a liquid crystal, or E Ink (Electronic Ink). Moreover, although the following description takes the organic EL element as an example of the electro-optical element, the description can be applied similarly to any light-emitting elements for which the amount of light emission is controlled in accordance with the amount of current.

The pixel circuit 10 is connected to two scanning signal lines $G_i$ and $G_{(i-1)}$, a control line $E_i$, a data line $S_j$, a pair of power lines $VP_j$, and an electrode having a common potential Vcom, as shown in FIG. 2. The TFT 11 has a source terminal connected to one conductive terminal of the TFT 13 and one conductive terminal of the TFT 15, and the TFT 11 also has a drain terminal connected to one conductive terminal of the TFT 12 and one conductive terminal of the TFT 14.

The other conductive terminal of the TFT 13 is connected to one of the power lines $VP_j$, which provides a power supply potential VDD. The other conductive terminal of the TFT 15 is connected to the data line $S_j$. The other conductive terminal of the TFT 14 is connected to an anode terminal of the organic EL element 17.

Furthermore, the aforementioned conductive terminal of the TFT 12 is connected to the drain terminal of the TFT 11, and the other conductive terminal of the TFT 12 is connected to a gate terminal (control terminal) of the TFT 11. Such connections allow the TFT 11 to be diode-connected.

Furthermore, the TFT 16 is connected at one conductive terminal to the power line $VP_j$ that provides the initialization potential Vini and at the other conductive terminal to the gate terminal, of the TFT 11. The data holding capacitor 18 is also connected at one terminal to the gate terminal of the TFT 11 and at the other terminal to the power line $VP_j$ that provides the power supply potential VDD. The organic EL element 17 has the common potential Vcom applied at its cathode terminal.

The scanning signal line $G_i$ is connected to a gate terminal (control terminal) of each of the TFTs 12 and 15. The TFTs 12 and 15 function as write control transistors. The scanning signal line $G_{(i-1)}$ is connected to a gate terminal (control terminal) of the TFT 16. The TFT 16 functions as an initialization control transistor. The control line $E_i$ is connected to a gate terminal (control terminal) of each of the TFTs 13 and 14. The TFTs 13 and 14 function as light-emission control transistors.

1.3 Operation of the Pixel Circuit

Figure 3:
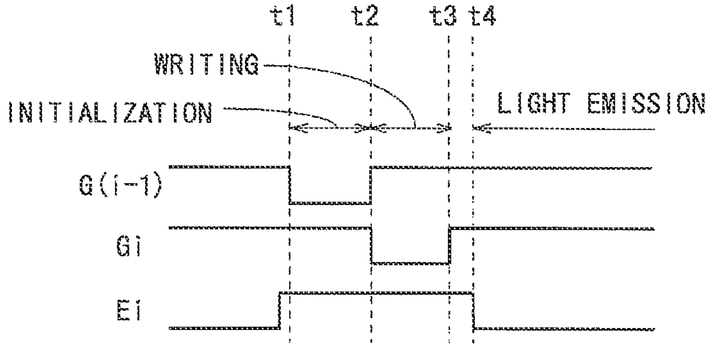
FIG. 3 is a timing chart showing a method for driving the pixel circuit in the embodiment.

FIG. 3 is a timing chart showing a method for driving the pixel circuit 10. Prior to time t1, the potentials of the scanning signal lines $G_{(i-1)}$ and $G_i$ are at high level, i.e., inactive, and the potential of the control line $E_i$ is at low level, i.e., active. In the previous frame, the control line $E_i$ is set to the inactive potential immediately before time t1, so that light emission is stopped, and then at time t1, the scanning signal line $G_{(i-1)}$ is activated, so that the gate terminal of the TFT 11 and the power line $VP_j$ that provides the initialization potential Vini are electrically connected, and the initialization is written to one terminal of the data holding capacitor 18 (and the gate terminal of the TFT 11 functioning as a drive transistor). The above operation is referred to as an initialization operation.

At time t2, the scanning signal line $G_{(i-1)}$ is deactivated, and the scanning signal line $G_i$ is activated, so that the TFTs 12 and 15 are turned on. Moreover, the potential of the data line $S_j$ is set to a level that accords with display data. Such a potential will be referred to below as a "data potential Vdata". Accordingly, the potential of node B shown at the source terminal of the TFT 11 changes to Vdata−Vth (where Vth is the threshold voltage of the TFT 11) because of the gate and drain terminals of the TFT 11 being short-circuited, and the potential of node B is stabilized at that voltage. Note that at this time, the TFT 14 is off, and therefore no current is applied to the organic EL element 17.

At time t3, the scanning signal line $G_i$ is deactivated, so that the TFTs 12 and 15 are turned off, and the data holding capacitor 18 holds a voltage having the value (VDD−Vdata+Vth) because its terminal is connected to the power supply potential VDD. The above operation is referred to as a writing operation.

Here, assuming that the capacitance value of the data holding capacitor 18 is c, the stored charge Q of the data holding capacitor 18 is represented by the following equation (1).

$$Q = c \times (VDD - V\text{data} + Vth) \quad (1)$$

At time t4, the control line $E_i$ is activated, so that the TFTs 13 and 14 are turned on. As a result, a current flows through the organic EL element 17, so that light emission is started. At this time, the potential of node B is set to the power supply potential VDD, and the value of the terminal-to-terminal voltage (i.e., the difference in potential between nodes A and B shown in the figure) of the data holding capacitor 18 becomes equal to the value of the terminal-to-terminal voltage immediately before time t4. The voltage will be denoted by Vgs below. After completion of the write period, no charges escape from node A, which is obvious from the connection relationships of the TFTs, so that the stored charge Q of the data holding capacitor 18 is held. Accordingly, the voltage Vgs can be represented by the following equation (2).

$$Vgs = (VDD - V\text{data}) + Vth \quad (2)$$

During the light, emission period (from time t4) as described above, the power supply potential VDD is set at a value allowing the TFT 11 to operate in the saturation region, and therefore, if the channel-length modulation effect is not taken into consideration, the current Ids that flows through the TFT 11 during the light emission period can be obtained by the following equation (3).

$$Ids = \tfrac{1}{2} \cdot W/L \cdot \beta \cdot Cox(Vg - Vth)^2 \quad (3)$$

In equation (3) W is the gate width, L is the gate length, μ is the carrier mobility, and Cox is the gate oxide capacitance.

Further, the following equation (4) can be derived from equations (2) and (3).

$$Ids = \tfrac{1}{2} \cdot \beta \cdot (VDD - V\text{data})^2 \quad (4)$$

In equation (4), $\beta = W/L \cdot \mu \cdot Cox$.

The current Ids shown in equation (4) changes in accordance with the data potential Vdata, but does not depend on the threshold voltage Vth of the TFT 11. Accordingly, even in the case where there are variations in the threshold voltage Vth, or the threshold voltage Vth changes over time, it is possible to apply the current to the organic EL element 17 in accordance with the data potential Vdata, thereby allowing the organic EL element. 17 to emit light with a desired luminance.

In this manner, the current is applied continuously to the organic EL element 17 while the potential of the control line $E_i$ is active, and therefore, the pixel circuits 10 in the i'th row emit light with a luminance in accordance with the data potential provided thereto. At this time, pixel, circuits 10 in the (i+1)'th and subsequent rows might be in the middle of the write period. That is, when a pixel circuit is in the middle of the write period, pixel circuits in previous rows are lit up. Accordingly, the power supply potential VDD might experience a voltage drop (i.e., an IR drop), and a change (here, a reduction) of the power supply potential VDD results in a change (here, a reduction) of the current Ids applied to the organic EL element 17 via the TFT 11, as is apparent from equation (4).

The amount of the change in the power supply potential VDD (voltage drop amount) can be represented by the value (Rvdd·Idrv) obtained by multiplying the resistance value Rvdd of the power line (more precisely, the resistance value of a current path from the power supply circuit to the organic EL element) by the value Idrv of the current flowing through the line, and therefore, assuming that the power supply potential VDD in equation (4) is the power supply potential in the power supply circuit 4, the current Ids that is applied to the TFT 11 under the influence of the voltage drop during the light emission period can be represented by the following equation (5).

$$Ids' = \tfrac{1}{2} \cdot \beta \cdot (VDD - Rvdd \cdot Idrv - V\text{data})^2 \quad (5)$$

Accordingly, to compensate for the influence of the voltage drop, the potential for Vdata in equation (5) is also required to be changed by the same value (Rvdd·Idrv) as the change of the power supply potential VDD. Specifically, such a change can be made by changing the tone voltage generated by the tone voltage generation circuit 9; the configuration of the tone voltage, generation circuit 9 will be described later, and the configuration of the display control circuit 1, which calculates the voltage drop amount (Rvdd·Idrv), will be described first.

1.4 Configuration of the Display Control Circuit

Figure 4:
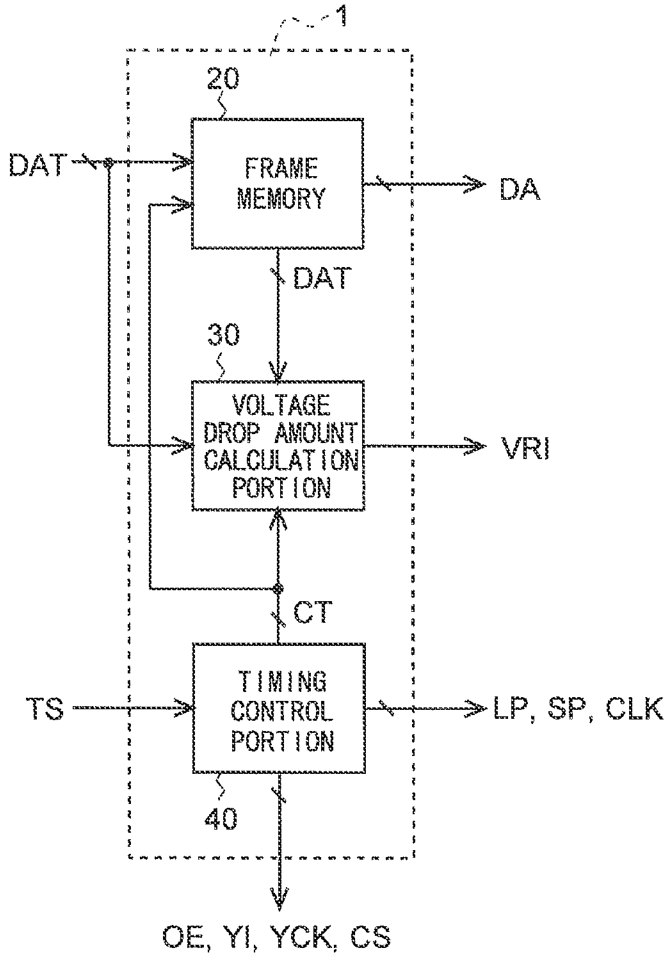
FIG. 4 is a block diagram illustrating in detail the configuration of a display control circuit in the embodiment.

FIG. 4 is a block diagram illustrating in detail the configuration of the display control circuit 1. The display control circuit 1 includes frame memory 20, a voltage drop amount calculation portion 30, and a timing control portion 40.

The timing control portion 40 receives an externally transmitted timing control signal TS, and generates the following: a control signal CT for controlling the operation of the frame memory 20 and the operation of the voltage drop amount calculation portion 30; a timing signal OE, a start pulse YI, and a clock YCK, which are outputted to the gate driver circuit 2; a start pulse SP, a clock CLK, and a latch pulse LP, which are outputted to the data driver circuit 3; and a control signal CS, which is outputted to the power supply circuit 4. The details and the timing of these signals are the same as in conventional display devices, and therefore, any detailed descriptions thereof will be omitted.

The frame memory 20 stores external display data signals DAT for one frame. Moreover, the frame memory 20 sequentially outputs the stored display data signals DAT for one frame to the data driver circuit 3 as display data DA, on the basis of the control signal CT from the timing control portion 40. Accordingly, the display data DA outputted after the storage in the frame memory 20 is data for one frame preceding the externally provided display data signals DAT. Note that the frame memory 20 may be included in an unillustrated host controller, which provides the display data signals DAT to the display control circuit 1, or may be included in an integrated circuit including the data driver circuit 3.

The voltage drop amount calculation portion 30 integrates display tones (pixel tone values) included in the external display data signals DAT, and multiplies the resultant value by a predetermined value, thereby calculating a voltage drop value VRI to be outputted to the tone voltage generation circuit 9. The configuration of the voltage drop amount calculation portion 30 will be described in detail with reference to FIGS. 5 and 6.

Figure 5:
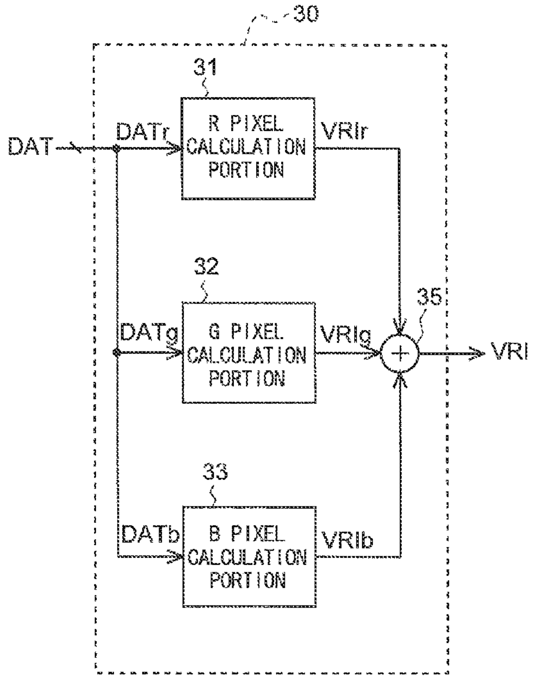
FIG. 5 is a block diagram illustrating in detail the configuration of a voltage drop amount calculation portion in the embodiment.

FIG. 5 is a block diagram illustrating in detail the configuration of she voltage drop amount calculation portion. The voltage trap amount calculation portion 30 includes an R pixel calculation portion 31 for calculating a voltage drop amount VRIr for pixel circuits that display red (referred to below as R pixels), a G pixel calculation portion 32 for calculating a voltage drop amount VRIg for pixel circuits that display green (referred to below as G pixels), a B pixel calculation portion 33 for calculating a voltage drop, amount VRIb for pixel circuits that display blue (referred to below as B pixels), and an adder 35 for adding up the voltage drop amounts VRIr, VRIg, and VRIb for respective pixel colors.

The R pixel calculation portion 31 shown in FIG. 5 outputs a voltage drop amount due to the R pixels being displayed (i.e., emitting light), after integrating red display data included in red display data signals DATr, which are 8-bit display data signals included in display data signals DAT and provided to the R pixels. Also, the G pixel calculation portion 32 outputs a voltage drop amount due to the G pixels being displayed (i.e., emitting light), after integrating green display data included in green display data signals DATg, which are 8-bit display data signals included in the display data signals DAT and provided to the G pixels. Moreover, the B pixel calculation portion 33 outputs a voltage drop amount due to the B pixels being displayed (i.e., emitting light), after integrating blue display data included in blue display data signals DATb, which are 8-bit display data signals included in the display data signals DAT and provided to the B pixels. In this manner, the R pixel calculation portion 31, the G pixel calculation portion 32, and the B pixel calculation portion 33 differ in the substance of the data to be inputted/outputted but operate in the same manner; therefore, in the following descriptions with reference to FIGS. 6 and 7, the detailed configuration and operation of the R pixel calculation portion 31 will be taken as an example, and any detailed descriptions about the configurations and operations of the G pixel calculation portion 32 and the B pixel calculation portion 33 will be omitted.

Figure 6:
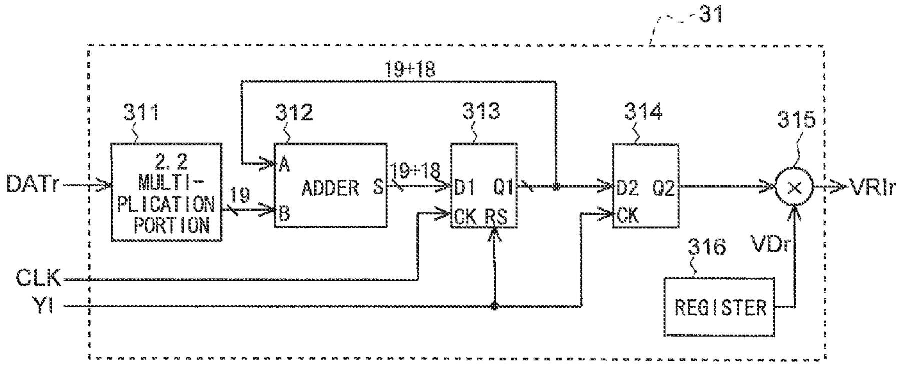
FIG. 6 is a block diagram illustrating in detail the configuration of an R pixel calculation portion in the embodiment.

FIG. 6 is a block diagram illustrating in detail the configuration of the R pixel calculation portion. The R pixel calculation portion 31 includes a 2.2 multiplication portion 311, an adder 312, a first flip-flop circuit 313, a second flip-flop circuit 314, a multiplier 315, and a register 316, as shown in FIG. 6.

The 2.2 multiplication portion 311 shown in FIG. 6 raises the value of the 8-bit red display data included in the externally received red display data signals DATr to the power of 2.2, and outputs 19-bit data. The outputted value resulting from the raising to the power of 2.2 is provided to a terminal B of the adder 312. Note that such calculation to the power of 2.2 can be readily realized by employing a well-known method, for example, by referencing a look-up table with previously entered calculation results.

The adder 312 receives a value outputted from a terminal Q1 of the first flip-flop circuit 313, at a terminal A, adds the value received at the terminal A and the value resulting from the raising to the power of 2.2 received at the terminal B, and outputs the resultant value from a terminal S.

The first flip-flop circuit 313 receives the resultant value outputted from the terminal S of the adder 312, at a terminal D1. The first flip-flop circuit 313 also receives a clock signal CLK, which is a horizontal synchronizing signal, at a clock terminal (terminal CK), and a start pulse YI, which is a vertical synchronizing signal, at a reset terminal (terminal RS).

In accordance with such input signals, the first flip-flop circuit 313 can obtain an integrated value by integrating tone values, which are red display data, every time the clock signal CLK rises.

Furthermore, the second flit-flop circuit 314 receives a value outputted from a terminal Q1 of the first flip-flop circuit 313, at a terminal D2. The second flip-flop circuit 314 also receives a start pulse YI, which is a vertical synchronizing signal, at a clock terminal (terminal CK), and outputs a value latched at the time, from the terminal Q2. The operations of the first and second flip-flop circuits 313 and 314 as above will be described with reference to FIG. 7.

Figure 7:
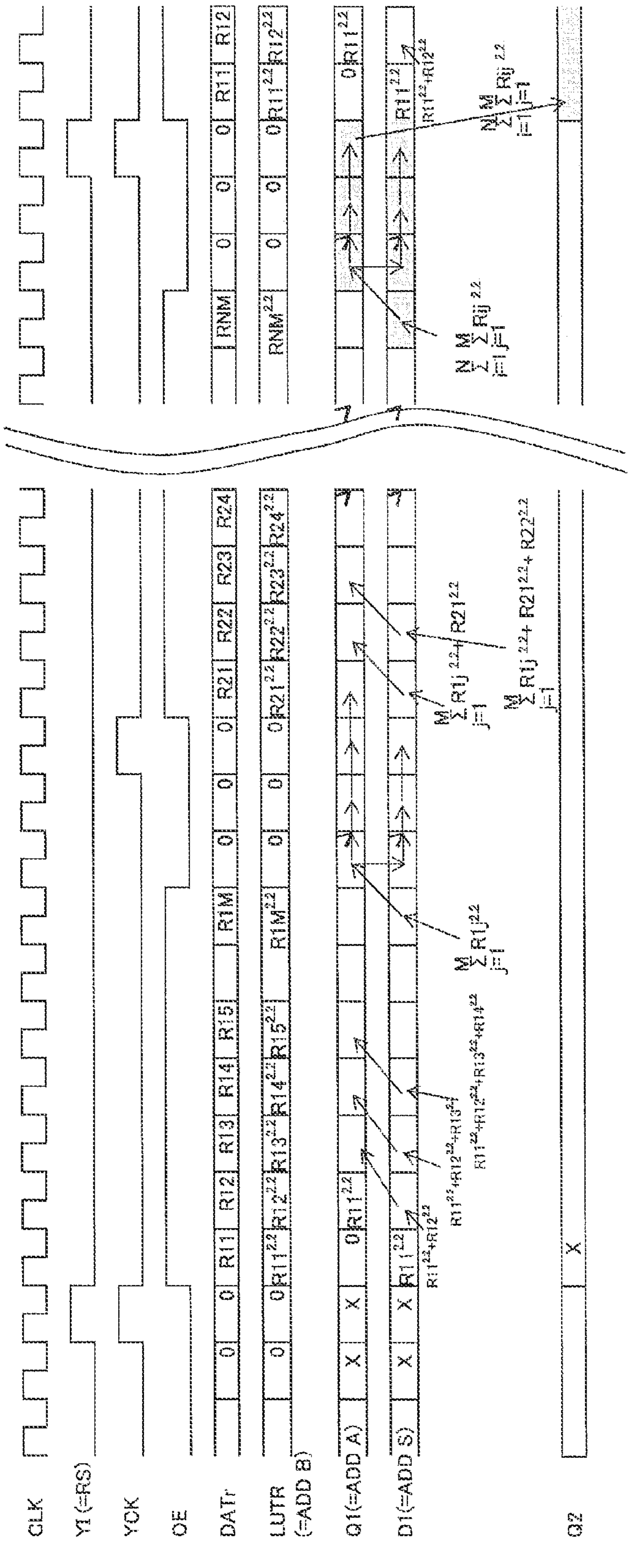
FIG. 7 is a timing chart describing the operations of various components included in the R pixel calculation portion in the embodiment.

FIG. 7 is a timing chart describing the operations of various components included in the R pixel calculation portion. As shown in FIG. 7, when a timing signal OE, which is an enable signal, is active, a red display data signal DATr is provided, and the 2.2 multiplication portion 311 outputs a value for the red display data raised to the power of 2.2 to the terminal B of the adder 312 as an output signal LUTR. Note that in the figure, the value for the red display data for the i'th column of the j'th row is denoted by "Rij", e.g., where i=1 and J=1 the value for the red display data is denoted by "R11".

As can be appreciated with reference to FIGS. 6 and 7, the first flip-flop circuit 313 is reset upon deactivation (i.e., upon fall) of the start pulse YI, which is a vertical synchronizing signal, and therefore, the value outputted from the output terminal Q1 at that time is zero. Thereafter, when the 2.2 multiplication portion 311 outputs the red display data value R11 raised to the power of 2.2, the value raised to the power of 2.2 ($R11^{2.2}$) is outputted from the terminal S because the value at the terminal A of the adder 312 is zero.

Next, when the clock signal GIN rises, the value raised to the power of 2.2 ($R11^{2.2}$) outputted from the terminal S is latched and outputted from the terminal Q1. The outputted value is provided to the terminal A of the adder 312, and then added to the value raised to the power of 2.2 ($R12^{2.2}$) provided to the terminal B of the adder 312, so that the resultant value is outputted from the terminal S.

When the clock signal CLK rises next, the sum ($R11^{2.2}+R12^{2.2}$) outputted from the terminal S is latched and outputted from the terminal Q1. In this manner, every time the clock signal CLK rises, the operation of integrating the red display data raised to the power of 2.2 is repeated. This operation is repeated until a reset upon fall of the next start pulse YI, which is a vertical synchronizing signal. That is, the red display data raised to the power of 2.2 for one frame is integrated.

Furthermore, the next start pulse YI, which is a vertical synchronizing signal, is provided to the clock terminal (terminal CK) of the second flip-flop circuit 314, and therefore, a value latched at this time, i.e., a value obtained by integrating the red display data raised to the power of 2.2 for one frame, is outputted from the terminal Q2 of the second flip-flop circuit 314. Thereafter, the output value of the second flip-flop circuit. 314 does not change upon reset of the first flip-flop circuit 313, and therefore, the integrated value is outputted from the terminal Q2 for one frame.

The multiplier 315 calculates a voltage drop amount VRIr for the red pixel circuits by multiplying the integrated value received from the second flip-flop circuit 314 by a coefficient VDr received from the register 316, and outputs the voltage drop amount.

Here, since the total number of red pixel circuits is (n·m/3), the integrated value (outputted from the terminal Q2) where display with the maximum tone value 255 is provided by all of the red pixel circuits is ($255^{2.2}\cdot(n\cdot m/3)$).

Accordingly, where the voltage drop amount due to display being provided at the maximum tone level by all of the red pixel circuits is (VRIr255), the coefficient VDr can be represented by the following equation (6).

$$VDr=(VRIr255)^{2.2}/(255^{2.2}\cdot(n\cdot m/3)) \quad (6)$$

Note that the voltage drop amount VRIr255 can be readily obtained by a numerical, calculation, a simulation, a measurement, or the like, and therefore, by calculating a coefficient VDr in advance on the basis of the obtained voltage drop amount VRIr255 in accordance with equation (6), and storing the coefficient in the register 316, the voltage drop amount VRIr for the red pixel circuits can be calculated accurately for each frame.

While only the operation of the R pixel calculation portion 31 has been described here, the G pixel calculation portion 32 and the B pixel calculation portion 33 operate in a similar manner, so that the voltage drop amount VRIg for the green pixel circuits and the voltage drop amount VRIb for the blue pixel circuits are calculated similarly, and these amounts are added by the adder 35 shown in FIG. 5, so that a voltage drop amount VRI is outputted.

Here, the voltage drop amount VRI outputted by the voltage drop amount calculation portion 30 indicates the voltage drop amount for the image during the immediately previous frame, as has been described with reference to FIGS. 6 and 7. However, the frame memory 20 shown in FIG. 4 stores external display data signals DAT for one frame. Moreover, the display data DA outputted by the frame memory 20 is data for one frame preceding the externally provided display data signals DAT, and therefore, the voltage drop amount VRI can be used. In this manner, since the current image data is corrected by applying its corresponding current voltage drop amount thereto, corrections are performed in so-called feed-forward mode and therefore are accurate. In particular, accurate corrections can be made even in cases where scene changes occur, which makes it possible to provide high-quality display.

Note that there is actually no significant change between images displayed in adjacent frames in the case where the images are still or even video. Accordingly, even when the voltage drop amount VRI for the immediately previous frame is considered to be the one for the current frame and is used without modification, in many cases, no significant display problem occurs, though the value is not accurate for the current frame. Accordingly, the frame memory 20 can be omitted. Next, the configuration of the tone voltage generation circuit 9 will be described in detail with reference to FIGS. 8 and 9.

1.5 Configuration of the Tone Voltage Generation Circuit

Figure 8:
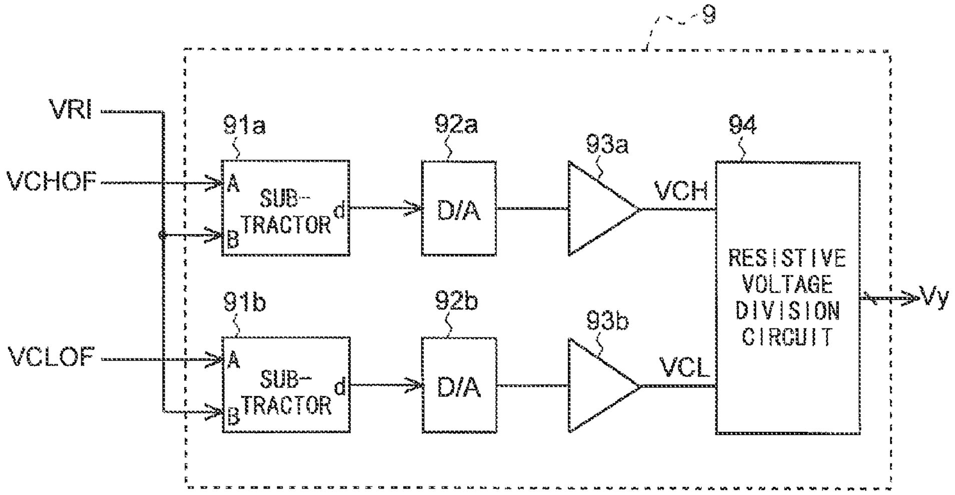
FIG. 8 is a block diagram illustrating in detail the configuration of a tone voltage generation circuit in the embodiment.

FIG. 8 is a block diagram illustrating in detail the configuration of the tone voltage generation circuit 9. The tone voltage generation circuit 9 includes two subtractors 91*a* and 91*b*, two D/A converters 92*a* and 92*b*, and two buffer circuits 93*a* and 93*b*.

The subtractor 91*a* receives a first offset voltage VCHOF at a terminal A and a voltage drop amount VRI outputted by the voltage drop amount calculation portion 30 at a terminal B. Here, the first offset voltage VCHOF is a predetermined offset voltage for the minimum tone value 0. The subtractor 91*a* outputs and provides a value (VCHOF) obtained by subtracting the value at the terminal B from the value at the terminal A, to the D/A converter 92*a*.

Furthermore, the subtractor 91*b* receives a second offset voltage VCLOF at a terminal A, and similarly, the voltage drop amount VRI outputted by the voltage drop amount calculation portion 30 at a terminal B. Here, the second offset voltage VCLOF is a predetermined offset voltage for the maximum tone value 255. The subtractor 91*b* outputs and provides a value (VCLOF−VRI) obtained by subtracting the value at the terminal B from the value at the terminal A, to the D/A converter 92*b*.

The two D/A converters 92*a* and 92*b* convert the received digital values into analog voltages, and the two buffer circuits 93*a* and 93*b*, which are operational amplifiers, receive the voltages, and then buffer and provide the voltages to opposite terminals of a resistive voltage division circuit 94.

Figure 9:
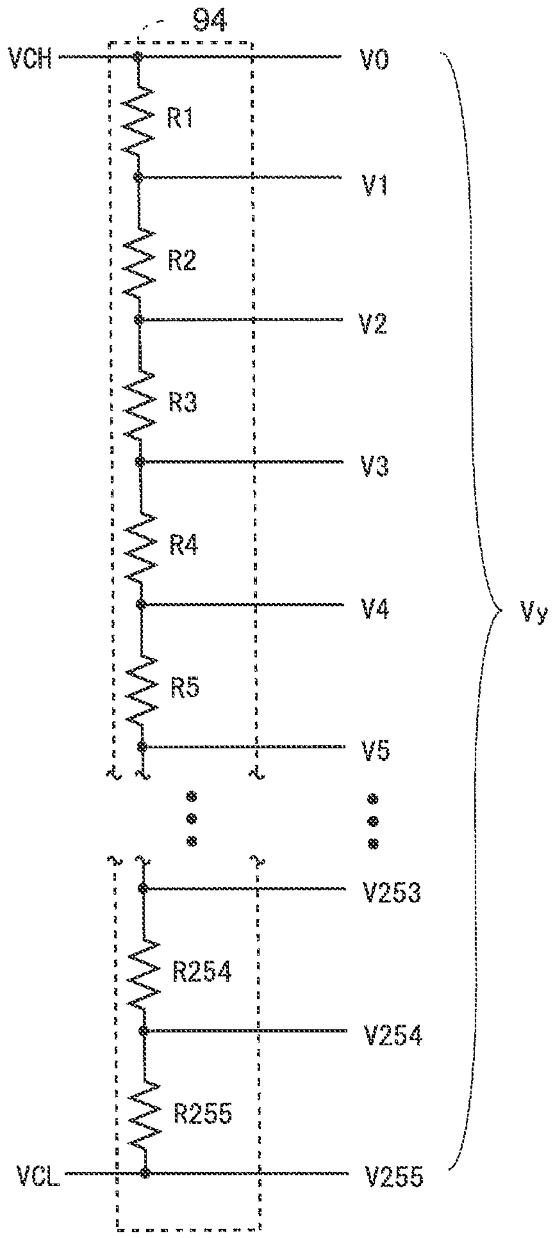
FIG. 9 is a circuit diagram illustrating in detail the configuration of a resistive voltage division circuit in the embodiment.

FIG. 9 is a circuit diagram illustrating in detail the configuration of the resistive voltage division circuit 94. The resistive voltage division circuit 94 consists of 255 resistors R1 to R255 connected in a series and outputting tone Vy (V0 to V255) from connecting points at both ends, as shown in FIG. 9.

Here, the tone voltages Vy are desirably set so as to obtain γ=2.2, which is an ideal gamma characteristic for displays. Therefore, the resistors R1 to R255 are determined so as to satisfy the ratio given by the following equation (7). Note that a is an integer in the range from 1 to 255.

$$R_n=(n^{1.1}-(n-1)^{1.1})\cdot R \quad (7)$$

Note that the emission luminance L of the organic EL element 17 shown in FIG. 2 is proportional to the current Ids flowing through the organic EL element 17 and also to the display tone value Yx raised to the power of 2.2, and therefore, equation (7) can be derived from the fact that the tone voltage Vy is in such a relationship as to be proportional to the display tone value Yx raised to the power of 1.1. However, in actuality, the square-law characteristics are not exhibited in the range where the current Ids in the TFT is low, and therefore, even in the case where equation (7) can be applied, corrections based on theoretical values might be made for a low tone range.

Figure 10:
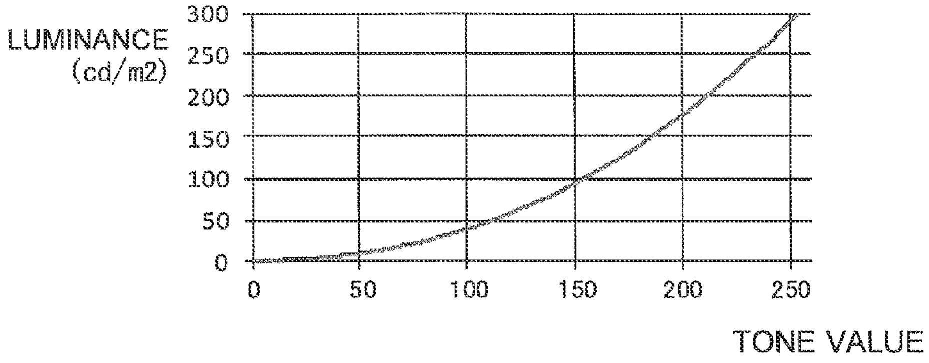
FIG. 10 is a graph showing the relationship between emission luminance and display tone in the embodiment.

FIG. 10 is a graph showing the relationship between the emission luminance and the display tone. The emission luminance is not proportional to the display none value, as shown in FIG. 10, and is determined so as to be proportional to the display tone value Yx raised no the power of 2.2, as described earlier. By making it possible to obtain such a gamma characteristic where $\gamma=2.2$, she display quality of the display device can be enhanced. However, $\gamma$ may be set to a different value for various reasons such as the characteristics of the display device. For example, even in the case where $\gamma=3.0$, a desired gamma characteristic can be readily obtained by calculating an appropriate resistance value with the gamma value replacing $\gamma=2.2$ in the present embodiment. Moreover, by using such a resistive voltage division circuit, it is rendered possible to generate high-definition tone data without generating any invalid output voltage.

1.6 Effects

As described above, the configuration of the present embodiment eliminates the need to apply a detection current in order to detect a voltage drop amount, so that there is no increase in power consumption, and the need to provide wiring for voltage drop amount detection is also eliminated, so that the wiring in the pixel circuits: is not increased; in such a configuration, voltage drop amounts are calculated for each frame on the basis of display tone data, and reference voltages for the tone voltage are changed on the basis of the calculated voltage drop amounts, so that it is possible to compensate for voltage drops with accuracy.

Furthermore, in the present embodiment, tone voltage values subjected to the same correction are provided for the R, B, and G pixels, and the reason for this is that the channel size of the TFTs 11 included in the pixel circuits for these colors is determined such that the TFTs 11 are approximately equal in gate voltage at their operating points. More specifically, it is often the case that the organic EL elements 17 have different characteristics depending on the color to be emitted, and therefore, the operating points are determined so as to be suited to the organic EL elements 17. Accordingly, the operating point of the TFT 11 included in the pixel circuit often varies among the colors. However, here, the channel size of the TFTs 11 included in the pixel circuits for the colors is adjusted appropriately, such that the gate voltage is approximately equal among the colors. This will be described below with reference to FIG. 11.

Figure 11:
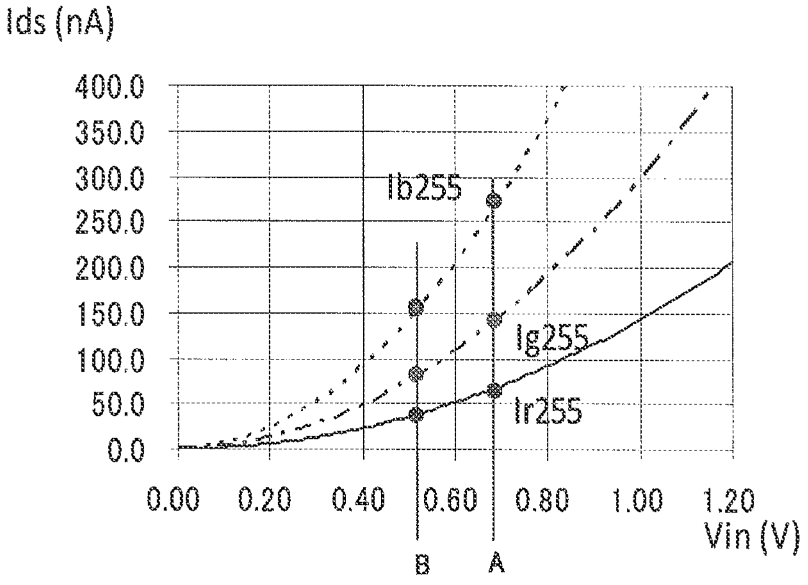
FIG. 11 is a graph showing operating points of drive TFTs in pixel circuits for respective colors in the embodiment.

FIG. 11 is a graph showing the operating points of the drive TFTs in the pixel circuits for the respective colors. As shown in FIG. 11, the gate voltages Vin respectively corresponding to the maximum tone value Ir255 for the R pixel, the maximum tone value Ig255 for the G pixel, and the maximum tone value Ib255 for the B pixel are equal at 0.70V on line A.

Here, when the voltage of the power line drops 0.25V, the gate voltages Vin of the drive TFTs in the pixel circuits for the colors also drop 0.25V down to 0.55V, and therefore are equal on line B. Since the operating points are determined in this manner, the tone voltage value and ins corrected value can be the same among the colors. Accordingly, it is not necessary to provide (three) individual tone voltage generation circuits for the colors, and therefore, it is possible to realize a driver circuit of a smaller chip size. Thus, it is possible to provide a more compact display device with lower power consumption.

2. Second Embodiment

2.1 Overall Configuration

Figure 12:
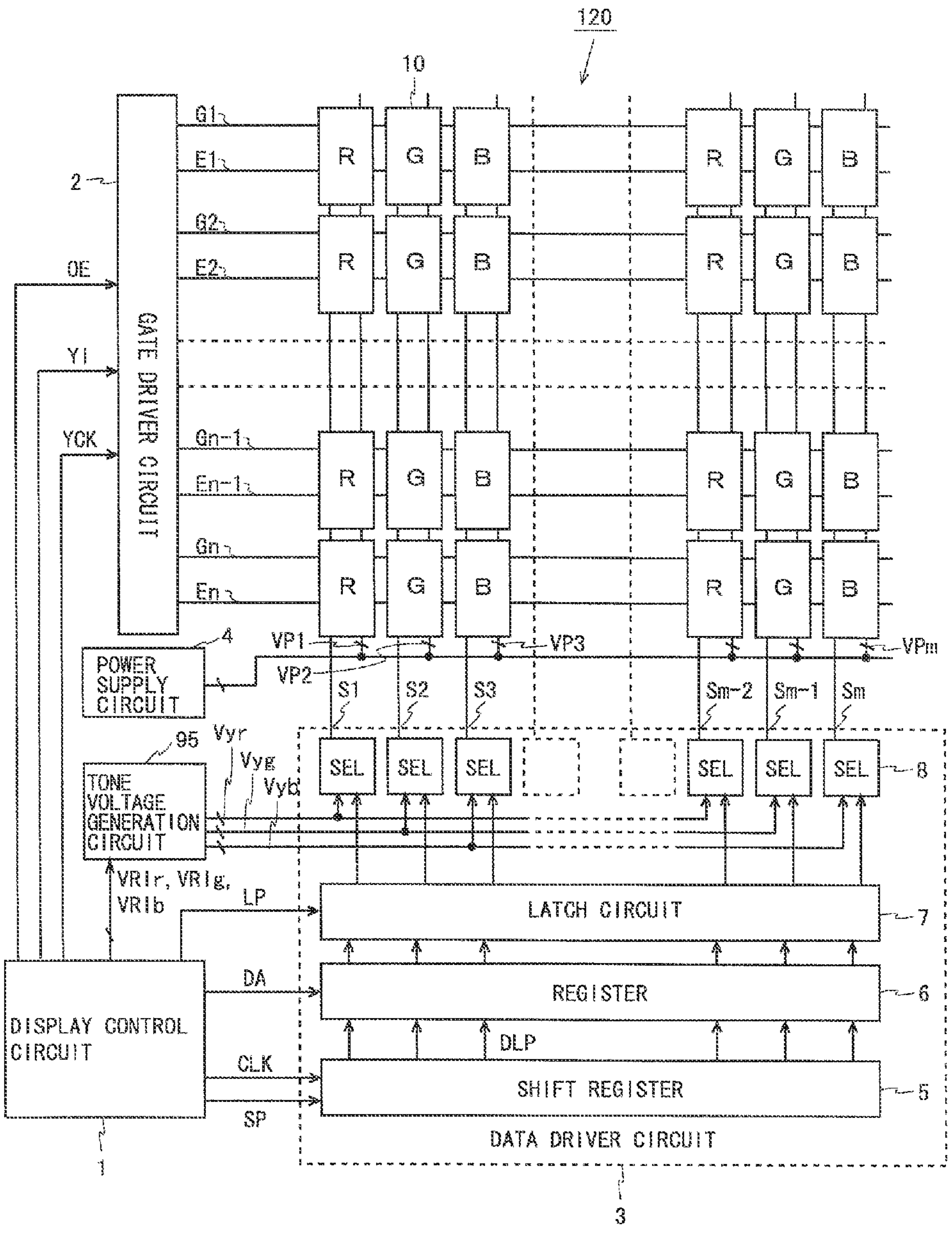
FIG. 12 is a block diagram illustrating the configuration of a display device according to a second embodiment of the present invention.

FIG. 12 is a block diagram illustrating the configuration of a display device according to a second embodiment of the present invention. The display device 120 shown in FIG. 12 has approximately the same configuration as the display device 110 of the first embodiment shown in FIG. 1, therefore the same components will be denoted by the same characters, and any descriptions thereof will be omitted. In the present embodiment, a tone voltage generation circuit 95 has a different configuration from that of the tone voltage generation circuit 9 in the first embodiment. Therefore, the configuration and the operation of the tone voltage generation circuit 95 will be described below with reference to FIGS. 13 and 14.

2.2 Configuration of the Tone Voltage Generation Circuit

Figure 13:
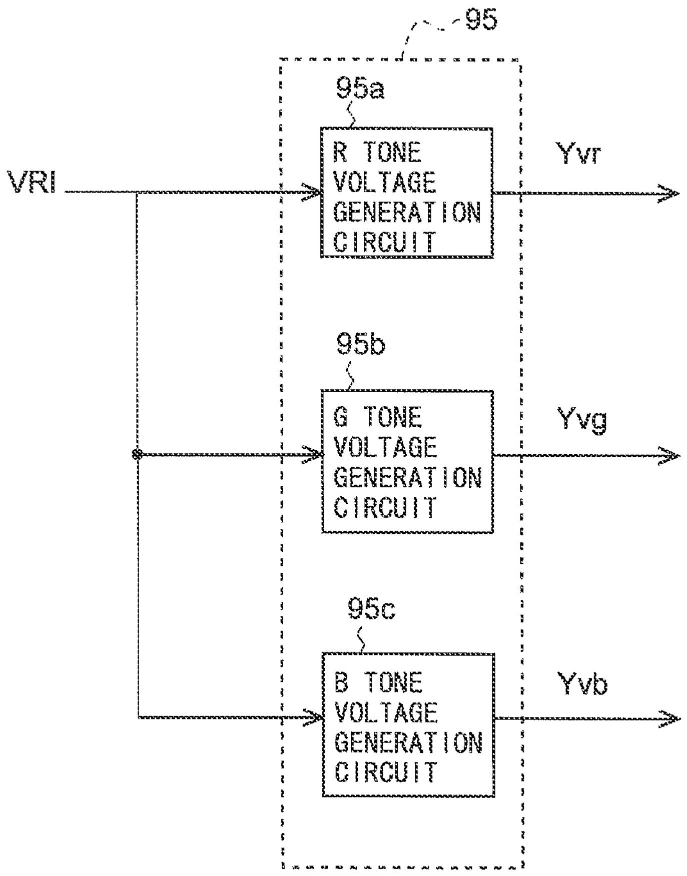
FIG. 13 is a block diagram illustrating in detail the configuration of a tone voltage generation circuit in the embodiment.

FIG. 13 is a block diagram illustrating in detail the configuration of the tone voltage generation circuit. The tone voltage generation circuit 95 shown in FIG. 13 includes an R tone voltage generation circuit 95*a*, a G tone voltage generation circuit 95*b*, and a B tone voltage generation circuit 95*c*. The details of the configuration are the same among these circuits and therefore will be described below taking the R tone voltage generation circuit 95*a* as an example with reference to FIG. 14.

Figure 14:
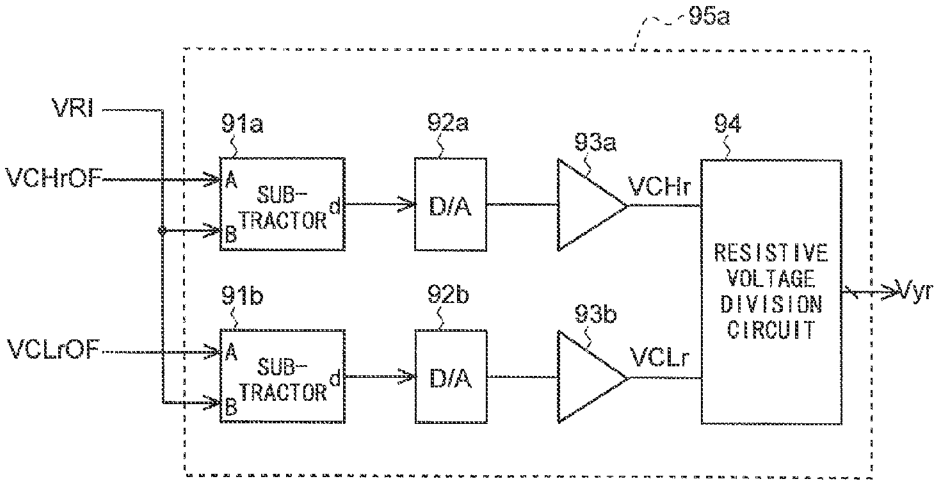
FIG. 14 is a block diagram illustrating in detail, the configuration of an R tone voltage generation circuit in the embodiment.

FIG. 14 is a block diagram illustrating in detail the configuration of the R tone voltage generation circuit 95*a*. As with the tone voltage generation circuit 9 shown in FIG. 8, the R tone voltage generation circuit 95*a* includes two subtractors 91*a* and 91*b*, two D/A converters 92*a* and 92*b*, and two buffer circuits 93*a* and 93*b*. These components operate in the same manner as in the first embodiment, and therefore, any descriptions thereof will be omitted herein, except that first and second offset voltages VCHrOF and VCLrOF for the R pixel are provided, and a tone voltage Yvr for the R pixel is outputted.

That is, the offset voltages are set in accordance with the color, and this is also true for the G tone voltage generation circuit 95*h* and the B tone voltage generation circuit 95*c*, and tone voltages Yvr, Yvg, and Yvb are generated individually for the colors and provided to the pixel circuits for their respective colors. Thus, it is possible to provide tone voltages at appropriate levels to the pixel circuits for the respective colors.

2.3 Effects

In this manner, in the present embodiment, as in the first embodiment, voltage drop amounts are calculated for each frame on the basis of display tone data, and reference voltages for the tone voltage are changed on the basis of the calculated voltage drop amounts, so that it is possible to compensate for voltage drops with accuracy without increasing power consumption and the wiring in the pixel circuits.

Furthermore, in the present embodiment, it is possible to provide tone voltage values corrected differently for the P, B, and G pixels, and this means that the operating point of the TFT 11 included in the pixel circuit can be determined freely for each color. More specifically, it is often the case that the organic EL elements 17 have different characteristics depending on the color to be emitted, and therefore, the operating points are determined so as to be suited to the organic EL elements 17. Accordingly, the operating point of the TFT 11 included in the pixel circuit often varies among the colors. Therefore, it is possible to compensate for the voltage drop of the power line without changing the channel size of the TFTs 11 included, in the pixel circuits for the respective colors, i.e., without rendering the gate voltage approximately equal among the colors. This will be described below with reference to FIG. 15.

Figure 15:
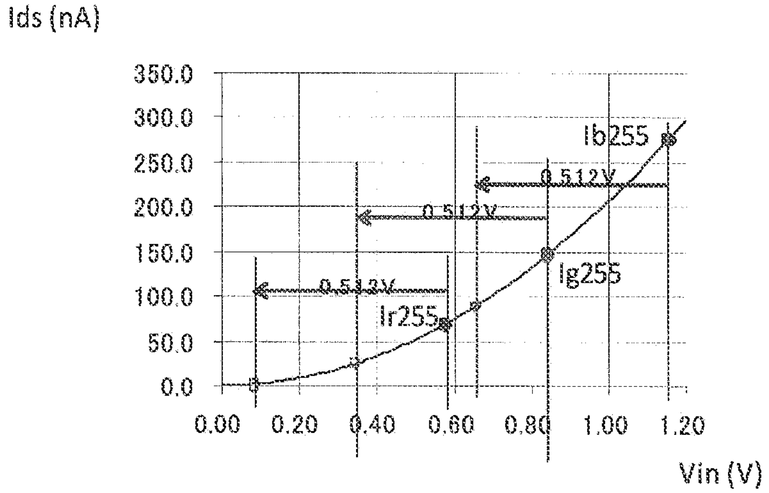
FIG. 15 is a graph showing operating points of drive TFTs in pixel circuits for respective colors in the embodiment.

FIG. 15 is a graph showing the operating points of the drive TFTs in the pixel circuits for the respective colors. As shown in FIG. 15, the gate voltages Vin respectively corresponding to the maximum, tone value Ir255 for the R pixel, the maximum, tone value Ig255 for the G pixel, and the maximum tone value Ib255 for the B pixel are different from one another.

Here, when the voltage of the power line drops 0.512V, the gate voltages Vin of the drive TFTs in the pixel circuits for the colors also drop 0.512V but still differ from one another. However, reference voltages for the tone voltage in the pixel circuit can be set individually (and suitably) for each color, and therefore, even in the above case, it is possible to compensate for the voltage drop of the power line with accuracy. In this manner, by providing the (three) individual tone voltage generation circuits for the respective colors, the TFTs included in the pixel circuits for the colors can have the same configuration and therefore can be manufactured readily, resulting in reduced manufacturing cost.

2.4 First Variant

Figure 16:
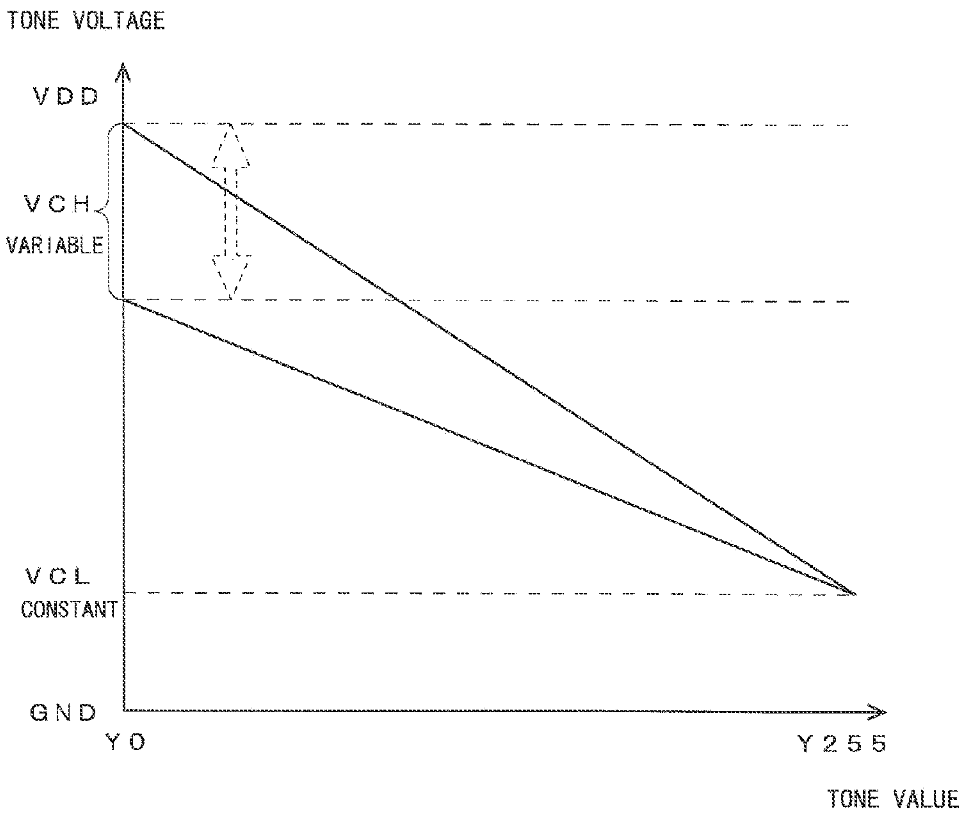
FIG. 16 is a graph describing the configuration of a first variant of the embodiment.

FIG. 16 is a graph describing the configuration of a first variant of the second embodiment. As shown in FIG. 16, the maximum reference voltage value VCH for the tone voltage in the low tone range can be varied, by correction, and the minimum value VCL in the high tone range is fixed without correction. This configuration renders it possible to omit the subtractor 91*b*, the D/A converter 92*b*, and the buffer circuit 93*b* shown in FIG. 14, resulting in reduced manufacturing cost.

Figure 17:
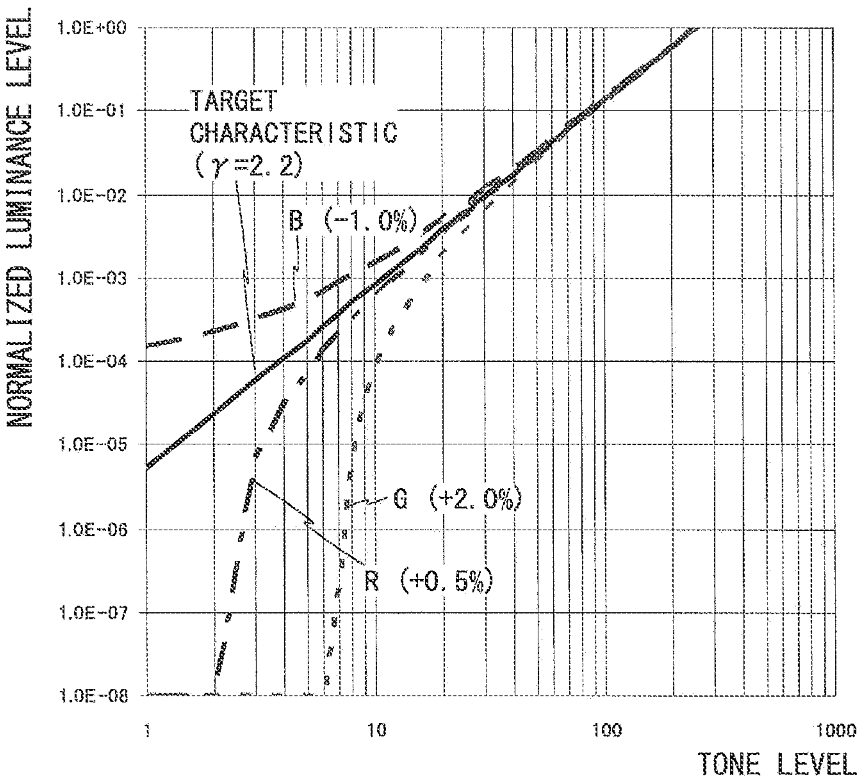
FIG. 17 is a graph describing the effect of improving display quality by changing the maximum value VCH in the variant.

Furthermore, such a configuration also renders it possible to improve the display quality of the display device. This will be described below with reference to FIG. 17. FIG. 17 is a graph describing the effect of improving the display quality by changing the maximum value VCH. FIG. 17 shows the tone level-normalized luminance characteristics where the maximum value VCH deviates from a target value; the maximum value VCH deviates +0.5% from the target value for the R pixel, +2.0% from the target value for the G pixel, and −1.0% from the target value for the B pixel. Accordingly, it can be appreciated that the tone level does not change much in the high tone range but changes significantly from the target value in the low tone range. Therefore, by suitably adjusting the maximum value VCH, it is rendered possible to suppress a change in tone level in the low tone range due to a voltage drop. Thus, the display quality can be improved.

2.5 Second Variant

Figure 18:
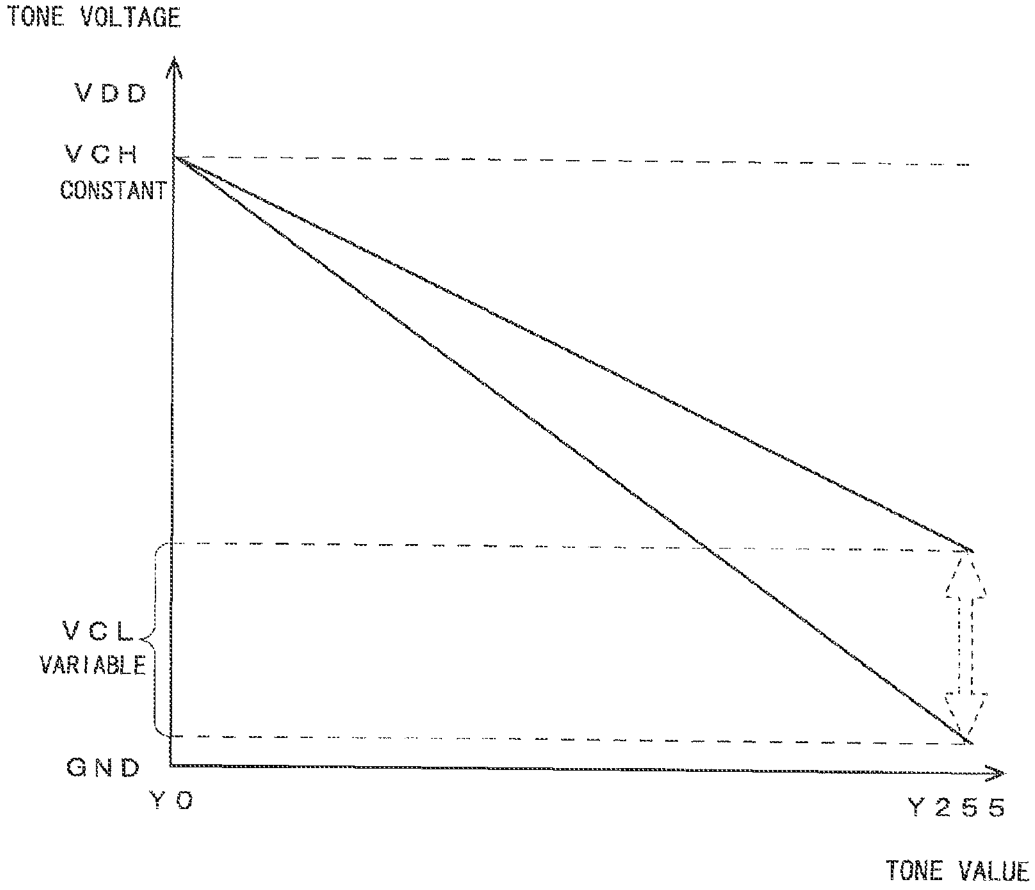
FIG. 18 is a graph describing the configuration of a second variant of the embodiment.

FIG. 18 is a graph describing the configuration of a second variant of the second embodiment. As shown in FIG. 18, the minimum reference voltage value VCL for the tone voltage in the high tone range can be varied by correction, and the maximum value VCH in the low tone range is fixed without correction. This configuration renders it possible to omit the subtractor 91*a*, the D/A converter 92*a*, and the buffer circuit 93*a* shown in FIG. 14, resulting in reduced manufacturing cost.

Figure 19:
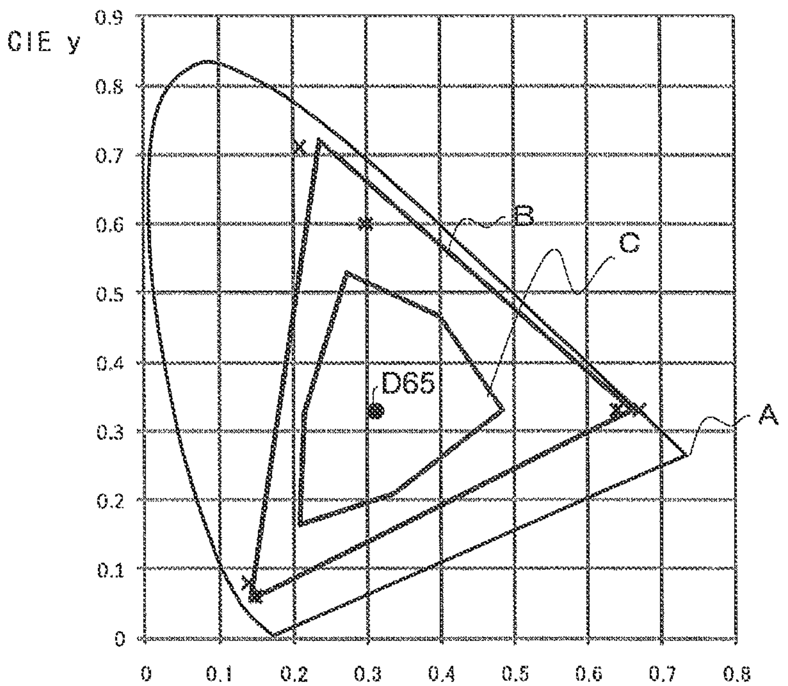
FIG. 19 is a diagram describing the effect of improving display quality by changing the minimum value VCH in the variant.

Furthermore, this configuration also renders it possible no improve the display quality of the display device. This will be described with reference to FIG. 19. FIG. 19 is a diagram describing the effect of improving the display quality by changing the minimum value VCL. In the CIE chromaticity diagram shown in FIG. 19, the range of the RGB color system is indicated at A, and the color reproduction range of the display device 120 is indicated at B. Here, C in the figure indicates the range of changes in display color with the R, G, and B tones being at the maximum value 255 where the voltages VCL corresponding to the minimum values VCLr, VCLg, and VCLb are increased or decreased in the range within 50%. In this manner, even if there is any deviation in color, adjustments to obtain, for example, white at D65 in the figure can be made freely and readily by appropriately adjusting the minimum value VCL. Thus, the display quality can be improved.

3. Third Embodiment

3.1 Overall. Configuration

Figure 20:
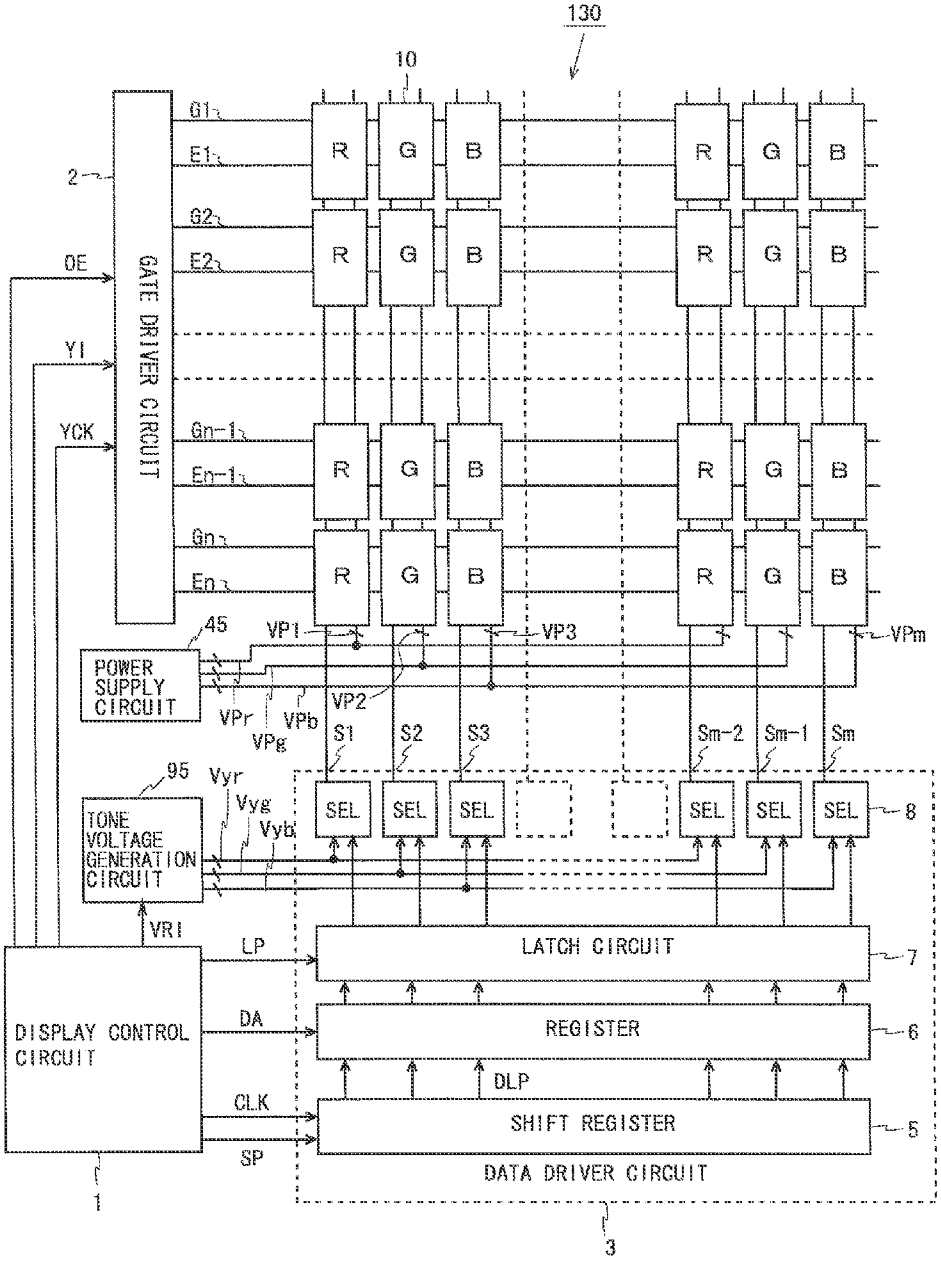
FIG. 20 is a block diagram illustrating the configuration of a display device according to a third embodiment of the present invention.

FIG. 20 is a block diagram illustrating the configuration of a display device according to a third embodiment of the present invention. The display device 130 shown in FIG. 20 has approximately the same configuration as the display device 120 in the second embodiment shown in FIG. 12, therefore the same components will be denoted by the same reference characters, and any descriptions thereof will be omitted. In the present embodiment, when compared to the second embodiment, the voltage drop amount calculation portion 30 and the tone voltage generation circuit 95 have slightly different configurations, and the power supply circuit 45 and the power wiring have significantly different configurations.

More specifically, the power supply circuit 45 includes an R pixel power line VPr coupled only to R pixels, a G pixel power line VPg coupled only to G pixels, and a B pixel power line VPb coupled only to B pixels, and these power lines are driven independently of one another, and receive respective potentials. Accordingly, voltage drops occur without any interference between the power lines. Therefore, the operation of compensating for the voltage drop is performed independently for each color. The configuration and the operation of the tone voltage generation circuit will be described below with reference to FIGS. 21 and 22.

3.2 Configuration of the Tone Voltage Generation Circuit

Figure 21:
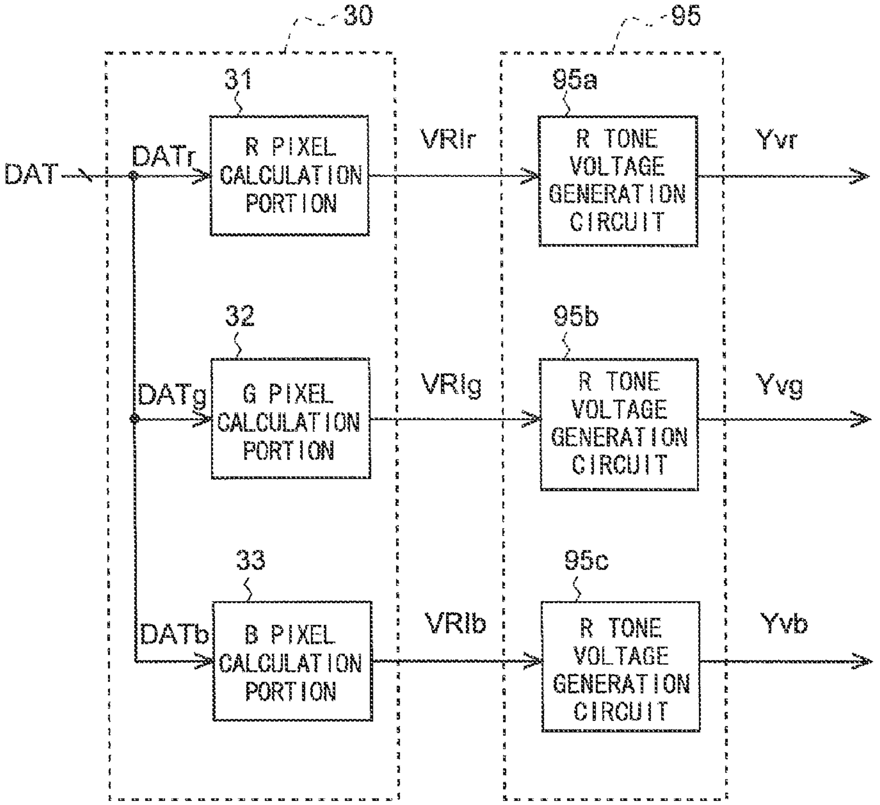
FIG. 21 is a block diagram illustrating in detail the configuration of a voltage drop amount calculation portion and the configuration of a tone voltage generation circuit in the embodiment.

FIG. 21 is a block diagram illustrating in detail the configuration of a voltage drop amount calculation portion and the configuration of a tone voltage generation circuit. The voltage drop amount calculation portion 30 shown in FIG. 21 includes an R pixel calculation portion 31, a G pixel calculation portion 32, and a B pixel calculation portion 33, which are the same as those included in the voltage drop amount calculation portion 30 shown in FIG. 5, but unlike in the configuration shown in FIG. 5, no adder is included. All other features are the same. More specifically, the voltage drop amounts VRIr, PRIg, and VRIb for the pixel circuits for di splaying the colors are individually provided to the tone voltage generation circuit 95 without being added together. Note that the configuration and the operation of each component of the voltage drop amount calculation portion 30 are similar in detail to chose in the first or second embodiment, and therefore, any descriptions thereof will be omitted herein.

Furthermore, the tone voltage generation circuit 95 includes an R tone voltage generation circuit 95*a*, a G tone voltage generation circuit 95*b*, and a B tone voltage generation circuit 95*c*, as shown in FIG. 21. The details of the configuration are the same among these circuits and therefore will be described below taking the R tone voltage generation circuit 95*a* as an example with reference to FIG. 22.

Figure 22:
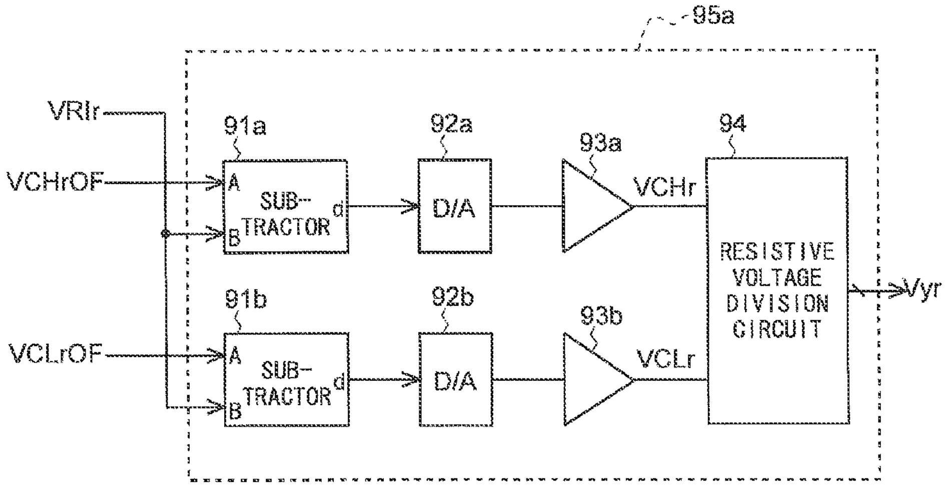
FIG. 22 is a block diagram illustrating in detail the configuration of an R tone voltage generation circuit in the embodiment.

FIG. 22 is a block diagram illustrating in detail the configuration of the R tone voltage generation circuit 95*a*. This R tone voltage generation circuit 95*a* includes the same components as the R tone voltage generation circuit 95*a* shown in FIG. 14, and therefore, any descriptions thereof will be omitted, except for the difference with the second embodiment in that the voltage drop amount VRIr for the R pixel is provided.

More specifically, offset voltages are set in accordance with the color, and this is also true for the G tone voltage generation circuit 95*b* and the B tone voltage generation circuit 95*c* and tone voltages Yvr, Yvg, and Yvb are generated individually for the colors and provided to the pixel circuits for their respective colors. In addition, the voltage drop amounts VRIr, VRIg, and VRIb for the pixel circuits for displaying the respective colors are also calculated independently of one another. Thus, it is possible to provide tone voltages at appropriate levels to the voltage drops of the power lines that occur in the pixel circuits for the colors independently of one another.

3.3 Effects

In this manner, in the present embodiment, as in the first embodiment, voltage drop amounts are calculated for each frame on the basis of display tone data, and reference voltages for the tone voltage are changed on the basis of the calculated voltage drop amounts, so that it is possible to compensate for voltage drops with accuracy without increasing power consumption and the wiring in the pixel circuits.

Further, in the present embodiment, corrections are performed by supplying power to the R, B, and G pixels through completely different lines, so that the voltage drop amounts of the power lines are reduced, and the voltage drop amounts can be compensated for with higher accuracy.

Still further, in the power supply configuration of the present embodiment, the divided voltage level for the switching 151 provided in the pixel circuit can be set to a lower value such that the voltage is relatively lower when compared to the case of a single power supply configuration. Thus, it is possible to reduce unnecessary power consumption of such switching elements.

4. Other Variants

The above embodiments have been described taking as examples the display devices in which the pixel circuits for displaying the R, G, and B colors are arranged, but the present invention can be applied to display devices other than such color display devices, and can be applied similarly even to display devices in which pixel circuits for colors other than R, C, and B or two or more colors selected from among the R, G, and B colors and other colors (e.g., pixel circuits for displaying four colors R, G, B, and W) are arranged.

The above embodiments have been described taking as an example the pixel circuit configuration shown in FIG. 2, but the pixel circuit configuration is not limited to that shown in FIG. 2, and various well-known circuits can be employed, so long as the organic EL elements 17 (or other electro-optical elements) are controlled by providing tone voltages to the drive TFTs.

Further, the above embodiments have been described with respect to the configuration where at least one of the maximum and minimum reference voltage values for the tone voltage is corrected, but corrections can be made with reference to either one specific tone voltage value, such as a median tone voltage value, or a plurality of tone reference voltages, so long as the tone voltage can be corrected.

Still further, in the configurations of the above embodiments, all display data (or all data for each color) are integrated, and voltage drop amounts Et re calculated on the basis of the integrated value, but in another configuration, only appropriately selected display data may be integrated as above, for example, some of the display data (e.g., every other or third pieces) may be integrated such that voltage drop amounts can be calculated or estimated from the selected pieces as a whole.

INDUSTRIAL APPLICABILITY

The present invention is applied to active-matrix display devices, and is particularly suitable for display devices, such as organic EL displays, which are provided with light-emitting display elements driven by a current.

DESCRIPTION OF THE REFERENCE CHARACTERS

1 display control circuit.
2 gate driver circuit
3 data driver circuit
4, 45 power supply circuit
5 sift register
6 register
7 latch circuit
8 selector circuit
9, 95 tone voltage generation circuit
10 pixel circuit
20 voltage drop amount calculation portion
11 to 16 TFT
17 organic EL element (electro-optical element)
110, 120, 130 display device
$G_i$ scanning signal line
$E_i$ control line
$S_j$ data line
$VP_i$ power line

The invention claimed is:

1. An active-matrix display device comprising:

a plurality of video signal lines configured to transmit signals representing an image to be displayed;

a plurality of scanning signal lines crossing the video signal lines;

a plurality of pixel circuits arranged in a matrix corresponding to intersections of the video signal lines and the scanning signal lines, to display a plurality of pixels forming the image to be displayed;

a power line for providing a power supply voltage to the pixel circuits;

a scanning signal line driver circuit configured to selectively drive the scanning signal lines;

a frame memory configured to store externally provided display data signals for one frame and to sequentially output the stored display data signals for one frame as previous frame display data;

a tone voltage generation portion configured to generate a plurality of tone voltages on the basis of reference voltages for voltages to be applied to the video signal lines, wherein the tone voltage generation portion comprises:

a voltage drop amount calculation portion configured to calculate the voltage drop amount on the basis of a value obtained by integrating tone values indicating display luminances of at least a part of the pixels;

a reference voltage setting portion configured to set maximum and minimum values for the tone voltages as reference voltages on the basis of the voltage drop amount; and a tone voltage output portion configured to generate and output tone voltage values on the basis of the maximum and minimum values of the reference voltages, wherein the tone voltage output portion is a resistive voltage division circuit configured to divide a voltage into voltages ranging from the maximum to the minimum values, the resistive voltage division circuit consisting of a plurality of resistors, the number of which is less than or equal to the number of tone voltages, and the plurality of resistors respectively have values that are given by the following equation: $Rn=(n^{1.1}-(n-1)^{1.1})\cdot R$, where R denotes a value of a first resistor that is defined as a resistor having a terminal provided with the maximum voltage among the plurality of resistors and Rn denotes a value of an n-th resistor among the plurality of resistors;

a video signal line driver circuit configured to generate the signals representing the image to be displayed by respectively selecting tone voltages for the plurality of video signal lines from among the plurality of tone voltages based on the previous frame display data, and configured to drive the video signal lines by applying the signals representing the image to be displayed; and a power supply circuit configured to provide a power supply voltage to the power line, wherein the pixel circuits include respective electro-optical elements driven by a current provided through the power line; and the tone voltage generation portion is configured to calculate a voltage drop amount of the power line due to the image being displayed, on the basis of tone values included in the externally provided display data signals and indicating display luminances of the pixels, without performing measurement for detection of the voltage drop amount, and is configured to set the reference voltage on the basis of the calculated voltage drop amount.

2. The display device according to claim 1, wherein, the pixel circuits is configured to display respective primary colors, the reference voltage setting portion is configured to set either the maximum or minimum value or both for each of the primary colors on the basis of the voltage drop amount, and the tone voltage output portion is configured to generate and output the tone voltage values for each of the primary colors on the basis of the maximum and minimum values.

3. The display device according to claim 2, wherein for each of the primary colors, the voltage drop amount calculation portion is configured to integrate tone values indicating display luminances for at least a part of the pixels displaying the primary color, and to calculate the voltage drop amount for the primary color on the basis of the resultant value for the primary color.

4. The display device according to claim 3, wherein, the power line is provided for each of the primary colors so as to provide corresponding power supply voltages to a plurality of pixel circuits forming a plurality of pixels for displaying the same primary color, and the power supply circuit is configured to provide the corresponding power supply voltage to the power line provided for each of the primary colors.

5. The display device according to claim 1, wherein the reference voltage setting portion is configured to set the maximum value for each of the primary colors and the minimum value common to the primary colors on the basis of the voltage drop amount.

6. The display device according to claim 1, wherein the reference voltage setting portion is configured to set the minimum value for each of the primary colors and the maximum value common to the primary colors on the basis of the voltage drop amount.

7. The display device according to claim 1, wherein the reference voltage setting portion is configured to set both the maximum and minimum values for each of the primary colors on the basis of the voltage drop amount.

8. The display device according to claim 1, wherein values for the resistors are configured such that a desired gamma characteristic is obtained.

9. The display device according to claim 1, wherein a pixel circuit of the plurality of pixel circuits includes a thin film transistor configured to supply a current to the electro-optical element so as to display one of a plurality of primary colors, and a channel size of the thin film transistor is set differently depending on a primary color displayed by the pixel circuit among the plurality of primary colors.

10. A method for driving an active-matrix display device including a plurality of video signal lines configured to transmit signals representing an image to be displayed, a plurality of scanning signal lines crossing the video signal lines, a plurality of pixel circuits arranged in a matrix corresponding to intersections of the video signal lines and the scanning signal lines, to display a plurality of pixels forming the image to be displayed, and a power line for providing a power supply voltage to the pixel circuits, the method comprising:

a scanning signal line drive step of selectively driving the scanning signal lines;

a display data output step of storing externally provided display data signals for one frame and sequentially outputting the stored display data signals for one frame as previous frame display data;

a tone voltage generation step of generating a plurality of tone voltages on the basis of reference voltages for voltages to be applied to the video signal lines, wherein the tone voltage generation step further includes:

a voltage drop amount calculating step for calculating the voltage drop amount on the basis of a value obtained by integrating tone values indicating display luminances of at least a part of the pixels;

a reference voltage setting step for setting maximum and minimum values for the tone voltages as reference voltages on the basis of the voltage drop amount; and a tone voltage output step for generating and outputting the tone voltages on the basis of the maximum and minimum values of the reference voltages, wherein in the tone voltage output step, a resistive voltage division circuit divides a voltage into voltages ranging from the maximum to the minimum values, the resistive voltage division circuit consisting of a plurality of resistors, the number of which is less than or equal to the number of tone voltages, and the plurality of resistors respectively have values that are given by the following equation: $Rn=(n^{1.1}-(n-1)^{1.1})\cdot R$, where R denotes a value of a first resistor that is defined as a resistor having a terminal provided with the maximum voltage among the plurality of resistors and Rn denotes a value of an n-th resistor among the plurality of resistors;

a video signal line drive step of generating the signals representing the image to be displayed by respectively selecting tone voltages for the plurality of video signal lines from among the plurality of tone voltages based on the previous frame display data, and driving the video signal lines by applying the signals representing the image to be displayed; and a power supply step of providing a power supply voltage to the power line, wherein the pixel circuits include respective electro-optical elements driven by a current provided through the power line, and in the tone voltage generation step, a voltage drop amount of the power line due to the image being displayed is calculated on the basis of tone values included in the externally provided display data signals and indicating display luminances of the pixels, without performing measurement for detection of the voltage drop amount, and the reference voltage is set on the basis of the calculated voltage drop amount.

* * * * *